(12) United States Patent
Choi et al.

(10) Patent No.: US 12,745,511 B2
(45) **Date of Patent: *Sep. 22, 2026**

(54) DISPLAY APPARATUS

(71) Applicant: LG Display Co., Ltd., Seoul (KR)

(72) Inventors: So-Hee Choi, Paju-si (KR); Jun-Ho Lee, Paju-si (KR); Sung-Bin Ryu, Paju-si (KR); Sung-Jin Lee, Paju-si (KR); Jei-Hyun Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 461 days.

This patent is subject to a terminal disclaimer.

(21) Appl. No.: 18/215,104

(22) Filed: Jun. 27, 2023

(65) Prior Publication Data

US 2024/0008311 A1 Jan. 4, 2024

(30) Foreign Application Priority Data

Jun. 30, 2022 (KR) ........................ 10-2022-0080937

(51) Int. Cl.
*H10K 59/121* (2023.01)
*H10D 30/67* (2025.01)
(Continued)

(52) U.S. Cl.
CPC ....... *H10K 59/1213* (2023.02); *H10D 86/423* (2025.01); *H10D 86/431* (2025.01); *H10D 86/60* (2025.01); *H10K 59/1216* (2023.02); *G06F 3/0446* (2019.05); *G09G 3/3208* (2013.01); *G09G 2300/0426* (2013.01); *G09G 2300/0819* (2013.01); *G09G 2300/0842* (2013.01); *H10D 30/6723* (2025.01); *H10D 86/421* (2025.01); *H10K 50/844* (2023.02); *H10K 59/124* (2023.02); *H10K 59/221* (2023.02); *H10K 59/38* (2023.02); *H10K 59/40* (2023.02)

(58) Field of Classification Search
CPC ........... H10K 59/1213; H10K 59/1216; H10K 59/00–95
See application file for complete search history.

(56) References Cited

U.S. PATENT DOCUMENTS

| | | | |
|---|---|---|---|
| 12,484,378 B1 * | 11/2025 | Chang ................ | H10K 59/1213 |
| 2021/0104558 A1 * | 4/2021 | Kim .................. | H10D 30/6731 |

(Continued)

FOREIGN PATENT DOCUMENTS

| | | |
|---|---|---|
| KR | 10-2017-0081060 A | 7/2017 |
| KR | 10-2021-0004794 A | 1/2021 |

(Continued)

*Primary Examiner* — Christine S. Kim
*Assistant Examiner* — Tyler J Wiegand
(74) *Attorney, Agent, or Firm* — Fenwick & West LLP

(57) ABSTRACT

A display apparatus includes a substrate having a display area and a non-display area; a first transistor including a first semiconductor layer on the substrate, a first insulating layer on the first semiconductor layer, a first gate electrode on the first insulating layer and a second insulating layer on the first gate electrode, a second transistor including a second semiconductor layer on the substrate and a second gate electrode on the first insulating layer, and a third transistor including a third semiconductor layer on the substrate and a third gate electrode on the second insulating layer.

12 Claims, 9 Drawing Sheets

(51) Int. Cl.

| | |
|---|---|
| ***H10D 86/40*** | (2025.01) |
| ***H10D 86/60*** | (2025.01) |
| ***H10K 50/844*** | (2023.01) |
| ***H10K 59/10*** | (2023.01) |
| ***H10K 59/124*** | (2023.01) |
| ***H10K 59/38*** | (2023.01) |
| ***H10K 59/40*** | (2023.01) |
| *G06F 3/044* | (2006.01) |
| *G09G 3/3208* | (2016.01) |

(56) References Cited

U.S. PATENT DOCUMENTS

2021/0217835 A1 7/2021 Park et al.
2022/0399420 A1* 12/2022 Chu .................. H10K 59/1216
2024/0008320 A1* 1/2024 Choi .................... H10D 86/423
2024/0040882 A1* 2/2024 Zhou .................... H10K 59/122
2024/0055535 A1* 2/2024 Cheng ................ H10D 30/6757

FOREIGN PATENT DOCUMENTS

KR 10-2021-0041150 A 4/2021
KR 10-2021-0090334 A 7/2021

* cited by examiner

DISPLAY APPARATUS

CROSS REFERENCE TO RELATED APPLICATIONS

The present application claims the benefit of and priority to Republic of Korea Patent Application No. 10-2022-0080937 filed in Republic of Korea on Jun. 30, 2022, which is incorporated herein by reference for all purposes as if fully set forth herein.

BACKGROUND

Technical Field

The present disclosure relates to a display apparatus, and more particularly, to a display apparatus where a performance is improved by improving a performance of a transistor.

Discussion of the Related Art

A display apparatus may include a liquid crystal display (LCD) apparatus, a field emission display (FED) apparatus and an organic light emitting diode (OLED) display apparatus. The OLED display apparatus among display apparatuses may be self-emitting display apparatus. The self-emitting display apparatus includes a plurality of subpixels, and an emitting device may be disposed in each of the plurality of subpixels without a separate light source to emit a light. Since the self-emitting display apparatus has a fast response speed and advantages in an emission efficiency, a luminance and a viewing angle as compared with the other display apparatuses, the emissive type display apparatus has been widely developed.

Further, since the emitting device may be formed on a flexible substrate, a display screen may have various shapes such as a bending shape or a folding shape. The OLED display apparatus may be applied to a small electronic apparatus such as a smart watch due to an excellent thin property.

Moreover, to use as a display apparatus for a smart watch displaying a still image, a display apparatus including a transistor of a new structure preventing a leakage current in the still image have been required. As a result, a semiconductor layer of an oxide semiconductor has been suggested for a thin film transistor having an advantage in blocking of a leakage current.

SUMMARY

Since a display apparatus including different semiconductor layers, for example, a polycrystalline semiconductor layer and an oxide semiconductor layer is fabricated through a process of forming the polycrystalline semiconductor layer and a process of forming the oxide semiconductor layer, a fabrication process is complicated. Further, since the polycrystalline semiconductor layer and the oxide semiconductor layer have different characteristics to a chemical gas, more complicated process is required.

A thin film transistor having the oxide semiconductor layer responds to a change of a threshold voltage more sensitively as compared with a thin film transistor having the polycrystalline semiconductor layer. In addition, when the thin film transistor having the oxide semiconductor layer has a change due to a current stress, an image and a reliability of the display apparatus are influenced by the thin film transistor having the oxide semiconductor layer. Moreover, since the thin film transistor having the oxide semiconductor layer has a relatively great current change with respect to a unit voltage change, a relatively low gray level region requiring a precise current control is deteriorated.

The inventors have recognized the above-mentioned problems and have conducted extensive research and experiments where the change of the threshold voltage is reduced and the performance of the display apparatus is improved. Through extensive research and experiments, a current change rate due to the current stress is reduced, and a new display apparatus having an improved performance is invented.

One or more aspects of the present disclosure are to provide a display apparatus where a performance is improved by improving a performance of a transistor.

Additional features, advantages, and aspects of the present disclosure are set forth in the present disclosure and in part will also be apparent from the present disclosure or may be learned by practice of the disclosure. Other features, advantages, and aspects of the present disclosure may be realized and attained by the structure particularly pointed out in the present disclosure, or derivable from, the written description, and claims hereof as well as the appended drawings.

To achieve these and other advantages and aspects of the present disclosure, as embodied and broadly described herein, a display apparatus may comprise a substrate having a display area and a non-display area; a first transistor including a first semiconductor layer on the substrate, a first insulating layer on the first semiconductor layer, a first gate electrode on the first insulating layer and a second insulating layer on the first gate electrode; a second transistor including a second semiconductor layer on the substrate and a second gate electrode on the first insulating layer; and a third transistor including a third semiconductor layer on the substrate and a third gate electrode on the second insulating layer.

In another aspect of the present disclosure, a display apparatus may comprise a substrate having a display area and a non-display area; a first transistor including a first semiconductor layer on the substrate, a first insulating layer on the first semiconductor layer and a first gate electrode on the first insulating layer; a second transistor including a second semiconductor layer on the substrate, the first insulating layer on the second semiconductor layer and a second gate electrode on the first insulating layer; and a third transistor including a third semiconductor layer on the substrate, the first insulating layer on the third semiconductor layer, a second insulating layer on the first insulating layer and a third gate electrode on the second insulating layer.

In another embodiment, a display apparatus may include a substrate having a display area and a non-display area, a first transistor including a first semiconductor layer on the substrate, the first semiconductor layer including oxide semiconductor, at least a part of a first insulating layer on the first semiconductor layer, and a first gate electrode on the part of the first insulating layer. The display apparatus may also include a second transistor including a second semiconductor layer on the substrate, the first insulating layer on the second semiconductor layer and a second gate electrode on the first insulating layer. The display apparatus may also include a third transistor including a third semiconductor layer on the substrate, the third semiconductor layer including oxide semiconductor. The third semiconductor layer may include a channel region, a source region, and a drain region. At least another part of the first insulating layer may be disposed on the third semiconductor layer, and at least a part of a second insulating layer may be disposed on the first insulating layer, and a third gate electrode may be disposed on the second insulating layer. At least a portion of the source region or the drain region may be exposed through an area between one end of the part of the first insulating layer disposed adjacent to the third semiconductor layer and the another part of the first insulating layer. The exposed portion may be doped with a dopant.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with aspects of the disclosure.

It is to be understood that both the foregoing description and the following description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure and together with the description serve to explain the principles of the disclosure.

Figure 1:
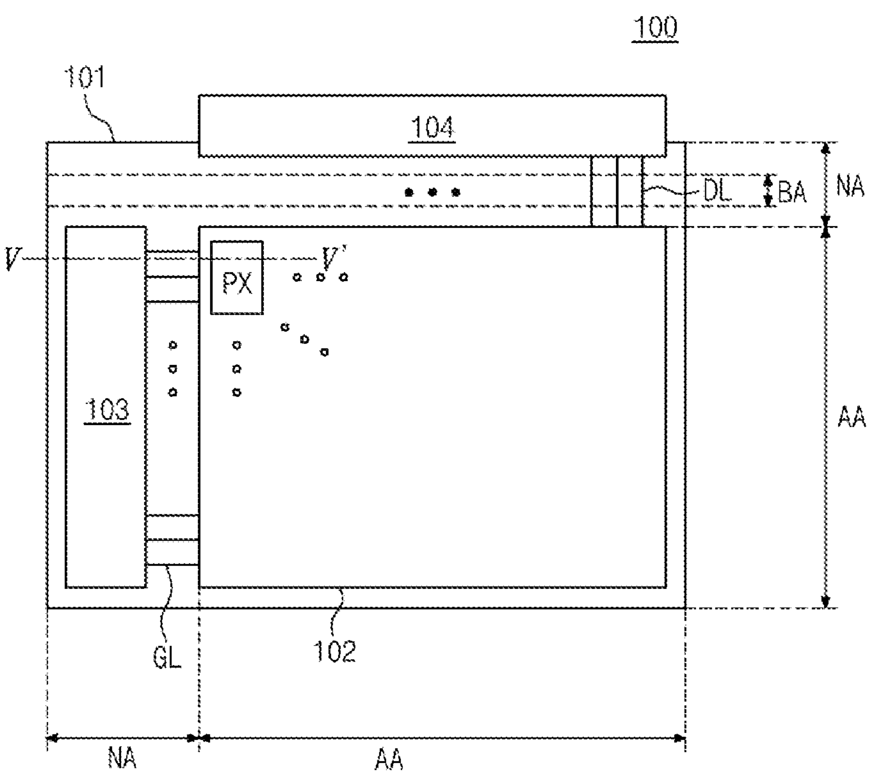
FIG. 1 illustrates a display apparatus according to an embodiment of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction of thereof may be exaggerated for clarity, illustration, and convenience.

DETAILED DESCRIPTION

Reference is now made in detail to embodiments of the present disclosure, examples of which may be illustrated in the accompanying drawings. In the following description, when a detailed description of well-known functions or configurations may unnecessarily obscure aspects of the present disclosure, the detailed description thereof may be omitted for brevity. The progression of processing steps and/or operations described is an example; however, the sequence of steps and/or operations is not limited to that set forth herein and may be changed, with the exception of steps and/or operations necessarily occurring in a particular order.

Advantages and features of the present disclosure, and implementation methods thereof, are clarified through the example embodiments described with reference to the accompanying drawings. The present disclosure may, however, be embodied in different forms and should not be construed as limited to the example embodiments set forth herein. Rather, these example embodiments are examples and are provided so that this disclosure may be thorough and complete to assist those skilled in the art to fully understand the present disclosure without limiting the protected scope of the present disclosure.

The shapes, sizes, areas, ratios, angles, numbers, and the like disclosed in the drawings for describing various example embodiments of the present disclosure are merely an example, and thus, the present disclosure is not limited to the illustrated details. Like reference numerals refer to like elements throughout.

Where the term “comprise,” “have,” “include,” “contain,” “constitute,” “make up of,” “formed of,” or the like is used, one or more other elements may be added unless the term such as “only” or the like is used. The terms used in the present disclosure are merely used in order to describe particular embodiments, and are not intended to limit the scope of the present disclosure. The terms used herein are merely used in order to describe example embodiments, and are not intended to limit the scope of the present disclosure. The terms of a singular form may include plural forms unless the context clearly indicates otherwise. The word “exemplary” is used to mean serving as an example or illustration. Embodiments are example embodiments. Aspects are example aspects. Any implementation described herein as an “example” is not necessarily to be construed as preferred or advantageous over other implementations.

In one or more aspects, an element, feature, or corresponding information (e.g., a level, range, dimension, size, or the like) is construed as including an error or tolerance range even where no explicit description of such an error or tolerance range is provided. An error or tolerance range may be caused by various factors (e.g., process factors, internal or external impact, noise, or the like). Further, the term “may” encompasses all the meanings of the term “can.”

In describing positional relationship where the positional relationship between two parts is described, for example, using “on,” “over,” “under,” “above,” “below,” “beneath,” “near,” “close to,” or “adjacent to,” “beside,” “next to,” or the like, one or more other parts may be located between the two parts unless a more limiting term, such as “immediate(ly),” “direct(ly),” or “close(ly),” is used. For example, when a structure is described as being positioned “on,” “over,” “under,” “above,” “below,” “beneath,” “near,” “close to,” or “adjacent to,” “beside,” or “next to” another structure, this description should be construed as including a case in which the structures contact each other as well as a case in which one or more additional structures are disposed therebetween. Furthermore, the terms “front,” “rear,” “back,” “left,” “right,” “top,” “bottom,” “downward,” “upward,” “upper,” “lower,” “up,” “down,” “column,” “row,” “vertical,” “horizontal,” and the like refer to an arbitrary frame of reference.

In describing a temporal relationship, when the temporal order is described as, for example, “after,” “subsequent,” “next,” and “before,” “preceding,” “prior to,” or the like a case that is not consecutive or not sequential may be included unless a more limiting term, such as “just,” “immediate(ly),” or “direct(ly)” is used.

It will be understood that, although the term “first,” “second,” or the like may be used herein to describe various elements, these elements should not be limited by these terms. These terms are only used to distinguish one element from another. For example, a first element could be a second element, and, similarly, a second element could be a first element, without departing from the scope of the present disclosure. Furthermore, the first element, the second element, and the like may be arbitrarily named according to the convenience of those skilled in the art without departing from the scope of the present disclosure. The terms “first,” “second,” and the like may be used to distinguish components from each other, but the functions or structures of the components are not limited by ordinal numbers or component names in front of the components.

In describing elements of the present disclosure, the terms “first,” “second,” “A,” “B,” “(a),” “(b),” or the like may be used. These terms are intended to identify the corresponding element(s) from the other element(s), and these are not used to define the essence, basis, order, or number of the elements.

For the expression that an element is “connected,” “coupled,” “attached,” or “adhered” to another element or layer the element or layer can not only be directly connected, coupled, attached, or adhered to another element or layer, but also be indirectly connected, coupled, attached, or adhered to another element or layer with one or more intervening elements or layers disposed or interposed between the elements or layers, unless otherwise specified. For the expression that an element or layer “contacts,” “overlaps,” or the like with another element or layer, the element or layer can not only directly contact, overlap, or the like with another element or layer, but also indirectly contact, overlap, or the like with another element or layer with one or more intervening elements or layers disposed or interposed between the elements or layers, unless otherwise specified.

The term “at least one” should be understood as including any and all combinations of one or more of the associated listed items. For example, the meaning of “at least one of a first item, a second item, and a third item” denotes the combination of all items proposed from two or more of the first item, the second item, and the third item as well as only one of the first item, the second item, or the third item.

The expression of a first element, a second elements “and/or” a third element should be understood as one of the first, second and third elements or as any or all combinations of the first, second and third elements. By way of example, A, B and/or C can refer to only A; only B; only C; any or some combination of A, B, and C; or all of A, B, and C. Furthermore, an expression “element A/element B” may be understood as element A and/or element B.

In one or more aspects, the terms “between” and “among” may be used interchangeably simply for convenience unless stated otherwise. For example, an expression “between a plurality of elements” may be understood as among a plurality of elements. In another example, an expression “among a plurality of elements” may be understood as between a plurality of elements. In one or more examples, the number of elements may be two. In one or more examples, the number of elements may be more than two.

In one or more aspects, the phrases “each other” and “one another” may be used interchangeably simply for convenience unless stated otherwise. For example, an expression “different from each other” may be understood as being different from one another. In another example, an expression “different from one another” may be understood as being different from each other. In one or more examples, the number of elements involved in the foregoing expression may be two. In one or more examples, the number of elements involved in the foregoing expression may be more than two. In one or more aspects, the phrases “one or more among” and “one or more of” may be used interchangeably simply for convenience unless stated otherwise.

In the present disclosure, “display apparatus” may include a display apparatus in a narrow sense such as liquid crystal module (LCM), an organic light emitting diode (OLED) module and a quantum dot (QD) module including a display panel and a driving part for driving the display panel. In addition, the term “display apparatus” may include a complete product (or a final product) including the LCM, the OLED module and the QD module such as a notebook computer, a television, a computer monitor, an equipment display apparatus including an automotive display apparatus or a shape other than a vehicle, and a set electronic apparatus or a set apparatus (or a set apparatus) such as a mobile electronic apparatus of a smart phone or an electronic pad.

Accordingly, a display apparatus of the present disclosure may include an applied product or a set apparatus of a final user’s apparatus including the LCM, the OLED module and the QD module as well as a display apparatus in a narrow sense such as the LCM, the OLED module and the QD module.

According to some embodiment of the present disclosure, the LCM, the OLED module and the QD module having a display panel and a driving part may be expressed as “a display apparatus”, and an electronic apparatus of a complete product including the LCM, the OLED module and the QD module may be expressed as “a set apparatus.” For example, a display apparatus in a narrow sense may include a display panel of a liquid crystal, an organic light emitting diode and a quantum dot and a source printed circuit board (PCB) of a control part for driving the display panel, and a set apparatus may further include a set PCB of a set control part electrically connected to the source PCB for controlling the entire set apparatus.

The display panel of the present disclosure may include all kinds of display panels such as a liquid crystal display panel, an organic light emitting diode display panel, a quantum dot display panel and an electroluminescent display panel. The display panel of the present disclosure is not limited to a specific display panel of a bezel bending having a flexible substrate for an organic light emitting diode display panel and a lower back plate supporter. A shape or a size of the display panel for the display apparatus of the present disclosure is not limited thereto.

For example, when the display panel is an organic light emitting diode display panel, the display panel may include a plurality of gate lines, a plurality of data lines and a pixel in a crossing region of the plurality of gate lines and the plurality of data lines. The display panel may include an array having a thin film transistor of an element for selectively applying a voltage to each pixel, an emitting element layer on the array and an encapsulating substrate or an encapsulation part covering the emitting element layer. The encapsulation part may protect the thin film transistor and the emitting element layer from an external impact and may prevent penetration of a moisture or an oxygen into the emitting element layer. In addition, a layer on the array may include an inorganic light emitting layer, for example, a nano-sized material layer or a quantum dot.

Features of various embodiments of the present disclosure may be partially or wholly coupled to or combined with each other, and may be variously inter-operated, linked or driven together. Embodiments of the present disclosure may be carried out independently from each other, or may be carried out together in a co-dependent or related relationship. In one or more aspects, the components of each apparatus according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

FIG. 1 illustrates a display apparatus according to an embodiment of the present disclosure.

A display apparatus 1000 according to an embodiment of the present disclosure may include a display panel 102. The display panel 102 may include a display area AA and a non-display area NA at a periphery of the display area AA on a substrate 101.

The substrate 101 may include a plastic material having flexibility for bending. For example, the substrate 101 may include polyimide (PI), polyethylene terephthalate (PET), polyethylene naphthalate (PEN), polycarbonate (PC), polyethersulfone (PES), polyarylate (PAR), polysulfone (PSF) and cyclo-olefin copolymer (COC) or the like, but embodiments of the present disclosure are not limited thereto. For example, a glass is not excluded as a material of the substrate 101. In another embodiment of the present disclosure, the substrate 101 may include a semiconductor material such as a silicon wafer.

The display area AA may be a region where a plurality of subpixels PX are disposed and an image is displayed. Each of the plurality of subpixels PX may be an individual unit emitting a light. An emitting element and a driving circuit may be disposed in each of the plurality of subpixels PX. For example, a display element for displaying an image and a circuit part for driving the display element may be disposed in each of the plurality of subpixels PX. The display element may include an organic light emitting element when the display apparatus 1000 is an organic light emitting diode display apparatus, and the display element may include a liquid crystal element when the display apparatus 1000 is a liquid crystal display apparatus. The plurality of subpixels PX may include a red subpixel PX, a green subpixel PX, a blue subpixel PX and/or a white subpixel PX, but embodiments of the present disclosure are not limited thereto.

The non-display area NA may be a region where an image is not displayed. The non-display area NA may be a region where various lines (or wires) and a driving integrated circuit for driving the plurality of subpixels PX in the display area AA are disposed. For example, at least one of a data driving part 104 and a gate driving part 103 may be disposed in the non-display area NA, but embodiments of the present disclosure are not limited thereto.

The non-display area NA may be a region surrounding the display area AA. For example, the non-display area NA may be disposed at a periphery of the display area AA. The non-display area AA may be a region extending from the display area AA or a region where the plurality of subpixels PX are not disposed, but embodiments of the present disclosure are not limited thereto. The non-display area NA where an image is not displayed may be a bezel region or may further include a bending region BA where the substrate 101 is bent, but embodiments of the present disclosure are not limited thereto.

A plurality of data lines DL and a plurality of gate lines GL may be disposed in the display area AA. For example, the plurality of data lines DL may be disposed in a row or a column, and the plurality of gate lines GL may be disposed in a column or a row. The subpixel PX may be disposed in a region defined by the data line DL and/or the gate line GL.

The subpixel PX of the display area AA may include a thin film transistor (TFT) or a transistor having a semiconductor layer. For example, the TFT or the transistor may include an oxide semiconductor material, but embodiments of the present disclosure are not limited thereto. For example, the TFT may be a transistor, but is not limited to a term.

According to the embodiment of the present disclosure, the gate driving part 103 including a gate driving circuit may be disposed in the non-display area NA. The gate driving circuit of the gate driving part 103 may sequentially drive pixel rows of the display area AA by sequentially supplying a scan signal to the plurality of gate lines GL. For example, the pixel row may be a row including the subpixels connected to one gate line. The gate driving circuit may be referred to as a scan driving circuit, but is not limited to a term.

The gate driving circuit may include a TFT having a polycrystalline semiconductor layer or a TFT having an oxide semiconductor layer. Alternatively, the gate driving circuit may include a pair of a TFT having a polycrystalline semiconductor layer and a TFT having an oxide semiconductor layer. When the TFT in the non-display area NA and the TFT in the display area AA include a same semiconductor material, the TFT in the non-display area NA and the TFT in the display area AA may be simultaneously formed by a same process, but embodiments of the present disclosure are not limited thereto.

The gate driving circuit may include a shift register, a level shifter, and the like.

The gate driving circuit may be a gate in panel (GIP) type to be disposed directly on the substrate 101 as in the display apparatus according to an embodiment of the present disclosure.

The gate driving part 103 including the gate driving circuit may sequentially supply a scan signal having an ON voltage or an OFF voltage to the plurality of gate lines GL.

The gate driving part 103 according to an embodiment of the present disclosure may be formed directly on the substrate 101 using a TFT including a polycrystalline semiconductor material as a semiconductor layer and may be formed directly on the substrate 101 using a complementary metal oxide semiconductor (C-MOS) of a TFT including a polycrystalline semiconductor material as a semiconductor layer and a TFT including an oxide semiconductor material as a semiconductor layer.

When a TFT having an oxide semiconductor layer and a TFT having a polycrystalline semiconductor layer are formed, a relatively high resolution and a relatively low power consumption may be obtained due to a relatively high electron mobility in a channel.

The display apparatus 1000 according to an embodiment of the present disclosure may further include the data driving part 104 including a data driving circuit. When a gate line GL is selected by the gate driving part 103 including a gate driving circuit, the data driving circuit of the data driving part 104 may convert an image data of a digital type into a data voltage of an analog type and may supply the data voltage to the plurality of data lines DL.

The plurality of gate lines GL disposed at the substrate 101 may include a plurality of scan lines and a plurality of emission lines or the like. The plurality of scan lines and the plurality of emission lines may be wires that transmit different types of gate signals (e.g., a scan signal and an emission signal) to gate nodes different types of transistors (e.g., a scan transistor and an emission transistor).

The gate driving part 103 including the gate driving circuit may include a scan driving circuit outputting the scan signals to the plurality of scan lines which are one type of the gate lines GL and an emission driving circuit outputting the emission signals to the plurality of emission control lines which are another type of the gate lines GL.

The display panel 102 according to an embodiment of the present disclosure may include the bending area BA where the substrate 101 is bent. The substrate 102 may maintain a flat state except for the bending area BA.

The data line DL may be disposed to pass through the bending area BA and various data lines DL may be disposed and connected to the data pads.

Figure 2:
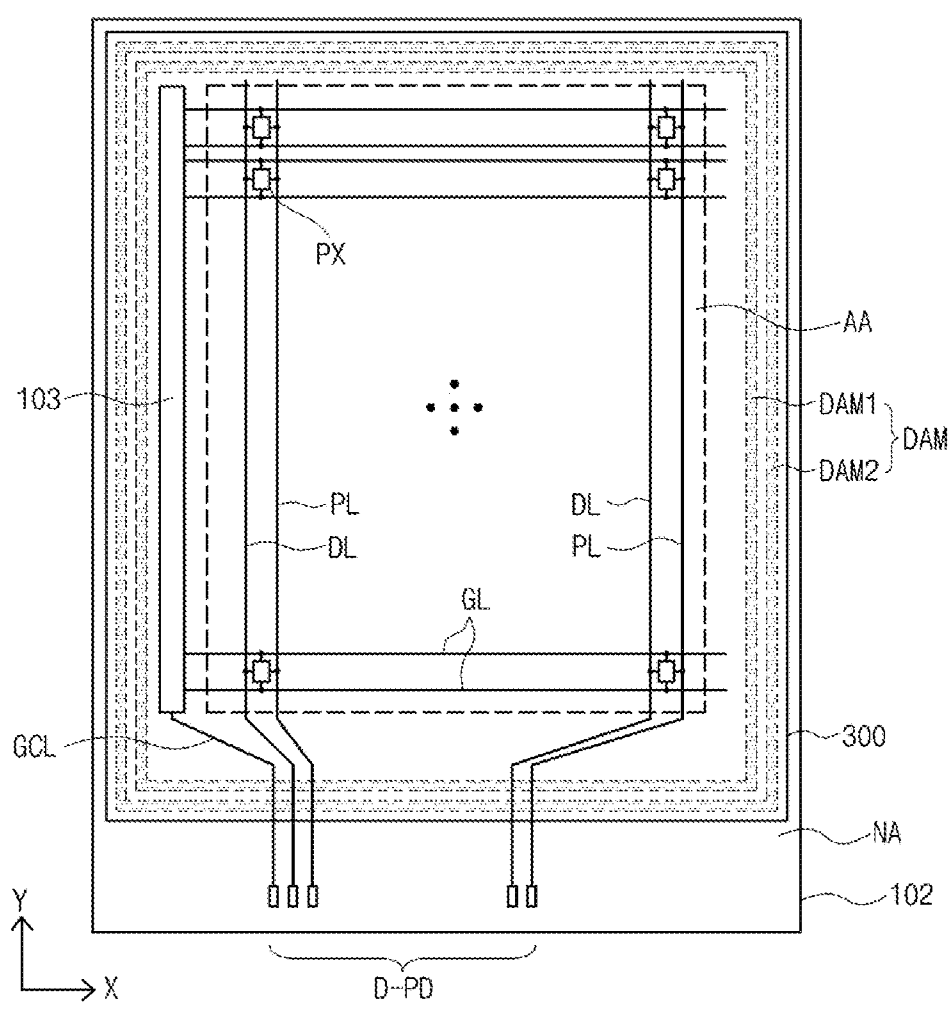
FIG. 2 is a plan view showing a display panel of a display apparatus, according to an embodiment of the present disclosure.
Figure 3:
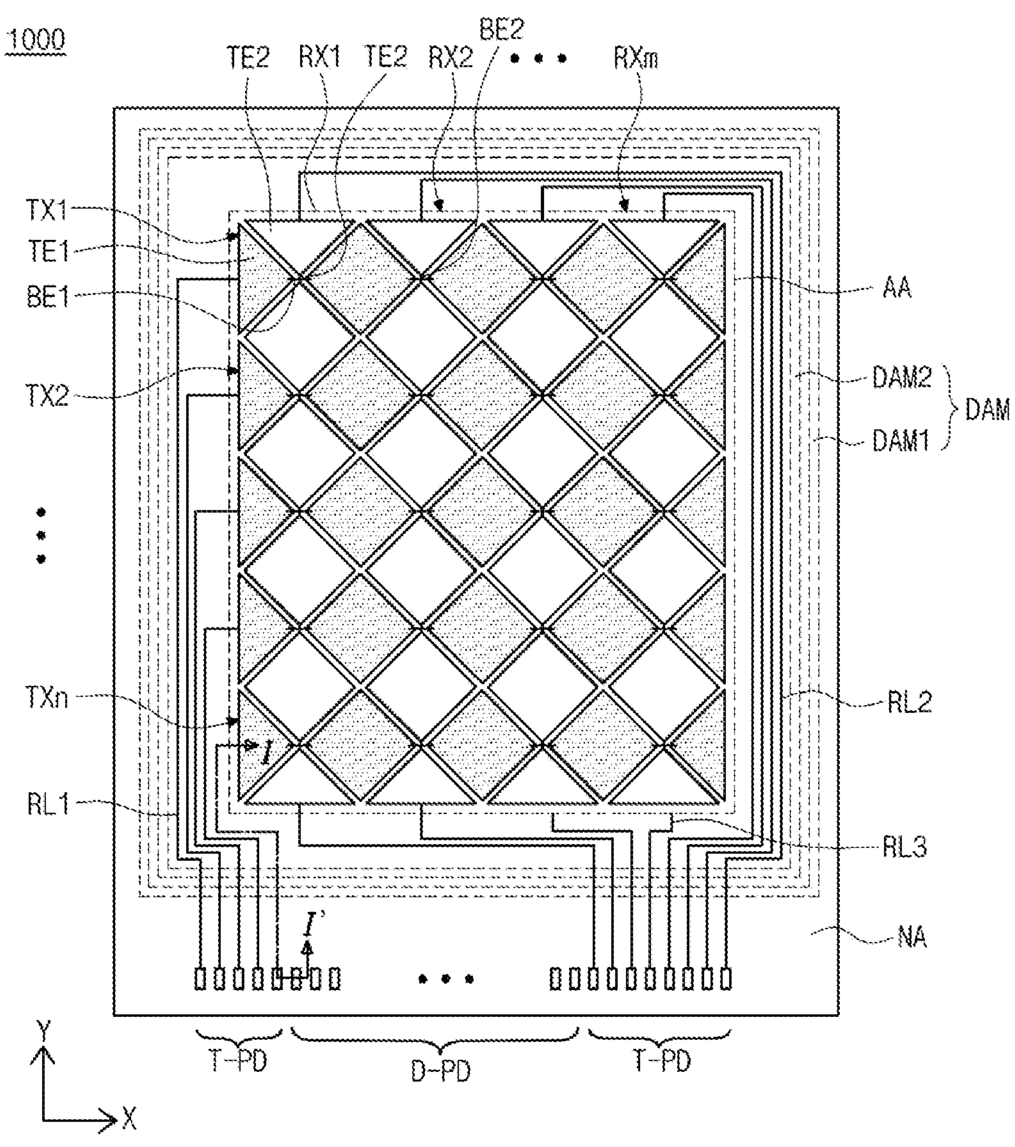
FIG. 3 is a plan view showing a touch part of a display apparatus, according to an embodiment of the present disclosure.

FIG. 2 illustrates a display panel of a display apparatus according to an embodiment of the present disclosure, and FIG. 3 illustrates a touch part of a display apparatus according to an embodiment of the present disclosure.

Referring to FIGS. 2 and 3, a display apparatus 1000 according to an embodiment of the present disclosure may include a display area AA and a non-display area NA. The display area AA may have functions of image display and touch sensing. The non-display area NA may be disposed outside the display area AA. The display area AA may be referred to as an active area, a pixel matrix area or a touch sensing area, but embodiments of the present disclosure are not limited thereto. The non-display area NA may be referred to as a bezel area, a non-active area or a touch non-sensing area, but embodiments of the present disclosure are not limited thereto.

The display apparatus 1000 according to a first embodiment of the present disclosure may include a display panel 102 and an encapsulation part 300.

The display panel 102 may be configured to display an image. For example, the display panel 102 may include a circuit element layer having a plurality of TFTs and an emitting element layer having a plurality of emitting elements for an image display. The encapsulation part 300 may be disposed to seal (or encapsulate) the emitting element layer on the display panel 102. A touch part having a touch sensing function may be disposed over the encapsulation part 300 with a buffer layer interposed therebetween. The buffer layer may have a relatively large thickness and may be formed of an organic material, but embodiments of the present disclosure are not limited thereto. An end portion of the buffer layer and an end portion of the encapsulation part 300 may be disposed as a steeped shape to have an end profile of a steeped shape, but embodiments of the present disclosure are not limited thereto. The display apparatus 1000 may further include an optically functional film such as a polarization film, an optically cleared adhesive (OCA), a cover substrate and a protection film (or a protective layer) on the touch part, but embodiments of the present disclosure are not limited thereto.

A pixel array including a plurality of subpixels PX for displaying an image and a plurality of first signal lines may be disposed in the display area AA of the display panel 102. The plurality of subpixels PX may include a red subpixel, a green subpixel and a blue subpixel. The plurality of subpixels PX may further include a white subpixel for increasing a luminance, but embodiments of the present disclosure are not limited thereto.

Each of the plurality of subpixels PX may be connected to the plurality of first signal lines including a gate line GL, a data line DL, and a power line PL. Each of the plurality of subpixels PX may include an emitting element and a pixel circuit independently driving the emitting element. The emitting element may include an organic light emitting diode, a quantum dot light emitting diode, or an inorganic light emitting diode, but embodiments of the present disclosure are not limited thereto. The organic light emitting diode may be exemplarily illustrated hereinafter.

A circuit element layer including a plurality of second signal lines connected to the display area AA and a plurality of pads D-PD may be disposed in the non-display area NA of the display panel 102. The plurality of second signal lines in the non-display area NA may include a link line, a power supply line and like connected to the plurality of first signal lines (GL, DL, PL, and the like) in the display area AA. The plurality of pads D-PD for connecting the plurality of second signal lines in the non-display area NA and a driving part may be disposed in a pad area provided on one side (or part) of the non-display area NA. The display panel 102 may include a lower pad among the plurality of pads D-PD, and may have a structure connected to an upper pad disposed on the touch part to be described later.

A gate driving part 103 driving the plurality of gate lines GL in the display area AA may be disposed in one portion or both portions of the non-display area NA of the display panel 102. The gate driving part 103 including at least one or more TFTs may be formed in the circuit element layer with the TFT in the display area AA. The gate driving part 103 may be receive a plurality of control signals from the driving part through the plurality of second signal lines and the plurality of pads D-PD in the non-display area NA.

The driving part may be mounted in the pad area where the plurality of pads D-PD are disposed or may be mounted on a circuit film. Or, the driving part may be connected to the plurality of pads D-PD through an anisotropic conductive film, but embodiments of the present disclosure are not limited thereto. The circuit film may include one of a chip on film (COF), a flexible printed circuit (FPC), and a flexible flat cable (FFC), but embodiments of the present disclosure are not limited thereto. The driving part may include a timing controlling part, a gamma voltage generating part, and a data driving part, but embodiments of the present disclosure are not limited thereto.

The encapsulation part 300 on the display panel 102 may overlap an entire of the display area AA. The encapsulation part 300 may extend to the non-display area NA to overlap a dam part (DAM) in the non-display area NA. The encapsulation part 300 may seal the emitting element of the display panel 102 to protect the emitting element. For example, the encapsulation part 300 may block penetration of a moisture and an oxygen to protect the emitting element. The encapsulation part 300 may have a lamination structure including at least one or more inorganic encapsulating layers and at least one or more organic encapsulating layers blocking inflow or flow of particles, but embodiments of the present disclosure are not limited thereto. The encapsulation part 300 may have a structure where the organic encapsulating layer having a relatively great thickness to cover particles between the inorganic encapsulating layers having a relatively small thickness. The organic encapsulating layer may be referred to as a particle cover layer (PCL), but is not limited to a term.

The dam part DAM may be disposed in the non-display area NA. The dam part DAM may prevent the organic encapsulating layer from flowing down or collapsing by restraining an end portion of the organic encapsulating layer of the encapsulation part 300. For example, the dam part DAM may surround a region including the display area AA and the gate driving part 103 of the display panel 102. The dam part DAM may have a closed loop shape, but embodiments of the present disclosure are not limited thereto.

The touch part may be disposed on the encapsulation part 300. The touch part may be a capacitance type where a touch signal reflecting a capacitance change due to a touch of a user is provided to a touch driving part. For example, the touch part may be a self-capacitance type where the touch signal reflecting the capacitance change of each touch electrode is independently provided to the touch driving part or may be a mutual capacitance type where the touch signal reflecting the capacitance change between first and second touch electrodes is provided to the touch driving part, but embodiments of the present disclosure are not limited thereto.

Since each of a plurality of touch electrodes constituting a touch sensing part of the touch part of a self-capacitance type has a capacitance of itself, the plurality of touch electrodes may be used as a touch sensor of a self-capacitance type sensing a capacitance change due to a touch of a user. The plurality of touch electrodes may be connected to a plurality of touch lines, respectively. For example, each of the plurality of touch electrodes may be electrically connected to one of the plurality of touch lines and may be insulated from the others of the plurality of touch lines. For example, a $m^{th}$ (m is a natural number) touch electrode may be electrically connected to a $m^{th}$ touch line through at least one contact hole, and may be electrically insulated from the other touch lines. Further, a $(m+1)^{th}$ touch electrode may be electrically connected to a $(m+1)^{th}$ touch line through at least one contact hole and may be electrically insulated from the other touch lines. The plurality of touch electrodes and the plurality of touch lines may be formed in different layers with a touch insulating layer therebetween and may be connected to each other through a contact hole in the touch insulating layer, but embodiments of the present disclosure are not limited thereto.

A touch part of a mutual capacitance type will be exemplarily illustrated hereinafter.

Referring to FIG. 3, the touch part may be disposed in the display area AA and may include a plurality of touch electrodes TE1 and TE2 constituting a touch sensor of a mutual capacitance type and a plurality of connecting electrodes BE1 and BE2. The touch part may include a plurality of touch routing lines RL1, RL2, and RL3 and a plurality of touch pads T-PD in the non-display area NA. When the touch part 400 is formed, the upper pads of the plurality of pads D-PD may be formed of a same metallic material in a same layer as upper pads of the plurality of touch pads T-PD of the touch part and may be formed of a same metallic material in a same layer as the plurality of touch electrodes TE1 and TE2, but embodiments of the present disclosure are not limited thereto.

The touch part may include a plurality of first touch electrode channels TX1 to TXn and a plurality of second touch electrode channels RX1 to RXm. The plurality of first touch electrode channels TX1 to TXn may be connected to the plurality of first touch electrodes TE1 disposed along a first direction (an X axis direction or a horizontal direction) in the display area AA and electrically connected to each other. The plurality of second touch electrode channels RX1 to RXm may be connected to the plurality of second touch electrodes TE2 disposed along a second direction (a Y axis direction or a vertical direction) in the display area AA and electrically connected to each other. The adjacent first and second touch electrodes TE1 and TE2 may constitute each touch sensor of a mutual capacitance type.

In each of the plurality of first touch electrode channels TXi (i=1, . . . , n), each of the plurality of first touch electrodes TE1 along the first direction X may be connected to the adjacent first touch electrode TE1 through a first connecting electrode BEL In each of the plurality of second touch electrode channels RXi (i=1, . . . , m), each of the plurality of second touch electrodes TE2 along the second direction Y may be connected to the adjacent second touch electrode TE2 through a second connecting electrode BE2. For example, the first touch electrode TE1 may be a transmitting electrode, and the second touch electrode TE2 may be a receiving electrode, but is not limited to a term. The plurality of first touch electrode channels Tx1 to Txn may be a transmitting channel, and the plurality of second touch electrode channels Rx1 to Rxm may be a receiving channel or a readout channel, but is not limited to a term. Each of the first and second touch electrodes TE1 and TE2 may have a lozenge shape, but embodiments of the present disclosure are not limited thereto. For example, each of the first and second touch electrodes TE1 and TE2 may have various polygonal shapes.

The plurality of touch routing lines RL1, RL2, and RL3 and the plurality of touch pads T-PD may be disposed in the non-display area NA of the touch part. The plurality of touch routing lines RL1, RL2, and RL3 may be connected to the plurality of touch electrode channels TX1 to TXn and RX1 to RXm in the display area AA. The plurality of touch pads T-PD may be connected to the plurality of touch routing lines RL1, RL2, and RL3. The plurality of touch routing lines RL1, RL2, and RL3 may overlap the encapsulation part 300 in the non-display area NA surrounding the display area AA. The touch driving part may be mounted on a circuit film and may be connected to the plurality of touch pads T-PD in the non-display area NA through an anisotropic conductive film, but embodiments of the present disclosure are not limited thereto.

One portion of each of the plurality of first touch electrode channels TX1 to TXn in the display area AA may be connected to the touch driving part through the plurality of first touch routing lines RL1 and the plurality of touch pads T-PD in the non-display area NA. The plurality of first touch routing lines RL1 may be individually connected to the plurality of touch pads T-PD in a lower region of the non-display area NA through one of left and right regions of the non-display area NA and the lower region of the non-display area NA.

Both portions of each of the plurality of second touch electrode channels RX1 to RXm in the display area AA may be connected to the touch driving part through the plurality of second touch routing lines RL2, the plurality of third touch routing lines RL3 and the plurality of touch pads T-PD in the non-display area NA. Since the plurality of second touch electrode channels RX1 to RXm used as a readout channel are longer than the plurality of first touch electrode channels TX1 to TXn, both portions of the second touch electrode channel RXi are connected to the touch driving part through the second and third touch routing lines RL2 and RL3 so that a resistance capacitance (RC) delay may be reduced and a touch sensing function may be improved.

For example, the plurality of second touch routing lines RL2 may be connected to one portion of the plurality of second touch electrode channels RX1 to RXm in an upper region of the non-display area NA and may be individually connected to the plurality of touch pads T-PD in a lower region of the non-display area NA through the other one of left and right region of the non-display area NA areas NA and the lower region of the non-display area NA. The plurality of third touch routing lines RL3 may be connected to the other portion of the plurality of second touch electrode channels RX1 to RXm in a lower region of the non-display area NA and may be individually connected to the plurality of touch pads T-PD in the lower region of the non-display area NA via the lower region of the non-display area NA.

The touch driving part may drive the plurality of first touch electrode channels TX1 to TXn and may receive a readout signal outputted from the plurality of second touch electrode channels RX1 to RXm. The touch driving part may generate a touch sensing data using the readout signal. For example, the touch driving part may generate a touch sensing signal reflecting whether a touch occurs or not by comparing the readout signals of the two adjacent channels through a differential amplifier and may convert the touch sensing signal into the touch sensing data of a digital type to output the touch sensing data to a touch controller. The touch controller may calculate a touch coordinate of a touch region based on the touch sensing data and may provide the touch coordinate to a host system.

The touch part according to the embodiment of the present disclosure may be disposed over the encapsulation part 300 in the display area AA with a buffer layer similar to the encapsulation part 300 interposed therebetween. Accordingly, a fabrication process may be simplified and a fabrication cost may be reduced as compared with a display apparatus of an attaching type of a touch panel. Since a touch sensing function is improved by reducing a parasitic capacitance between the touch part and the display panel 102, a reliability of the display apparatus 1000 may be improved.

Since the end portion of the buffer layer and the end portion of the encapsulation part 300 are disposed as a stair shape, the end portion of the buffer layer of the touch part and the end portion of the encapsulation part may have a cross-sectional profile of a stair shape. The plurality of touch routing lines RL1, RL2, and RL3 may be disposed along the stair-shaped end portion of the buffer layer and the encapsulation part 300. For example, each of the plurality of touch routing lines RL1, RL2, and RL3 may include a lower routing line along the end portion of the encapsulation part 300 and an upper routing line along the end portion of the buffer layer and connected to the lower routing line through a contact hole on the end portion of the encapsulation part 300. Since the plurality of touch routing lines RL1, RL2 and RL3 are stably formed in a region of the stair-shaped end portion of the organic buffer layer and the encapsulation part 300 without deterioration of an electric open, a yield and a reliability of the display apparatus 1000 may be improved.

Figure 4:
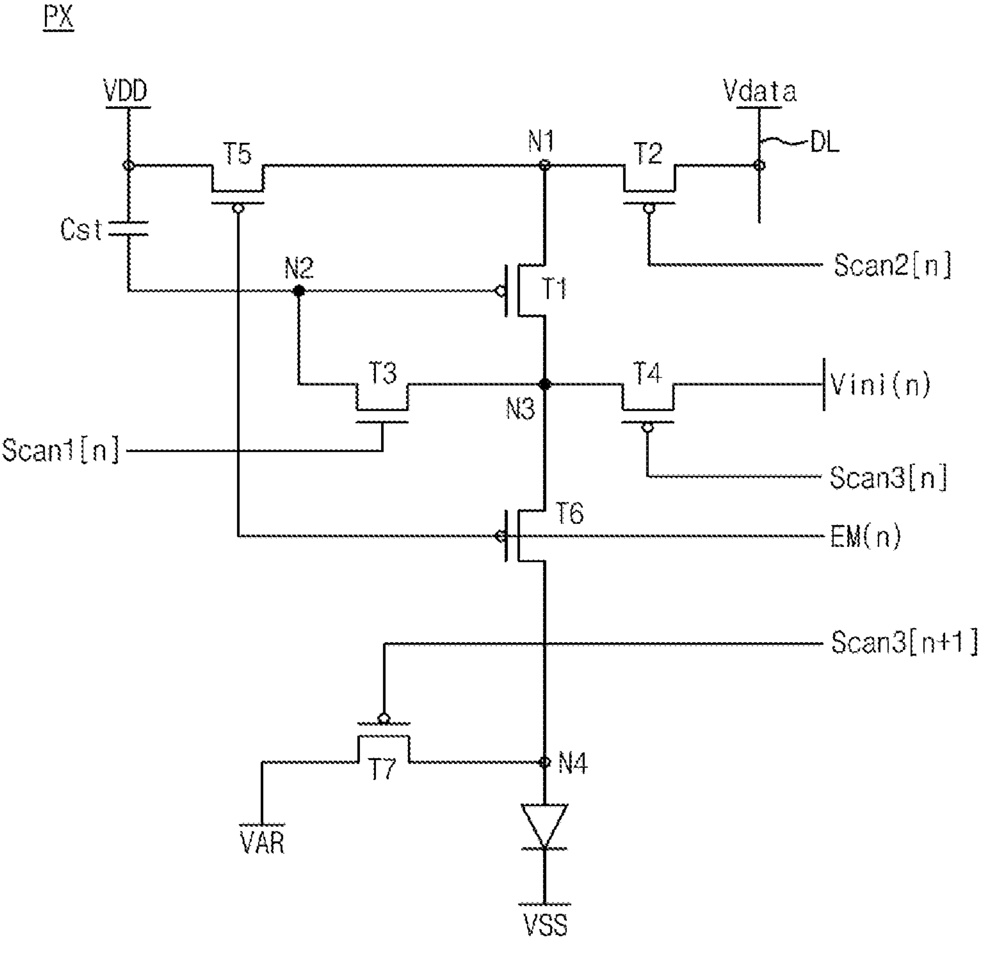
FIG. 4 illustrates a pixel circuit of a display apparatus, according to an embodiment of the present disclosure.

FIG. 4 illustrates a pixel circuit of a display apparatus, according to an embodiment of the present disclosure.

FIG. 4 shows a pixel circuit having seven TFTs and one storage capacitor, but embodiments of the present disclosure are not limited thereto. For example, the present disclosure is not limited to the embodiment of FIG. 4 and may be applied to an inner compensation circuit having various structures. One of the seven TFTs may be a driving TFT and the others of the seven TFTs may be switching TFTs for an inner compensation. For example, the pixel circuit may include six TFTs and one storage capacitor.

Referring to FIG. 4, each subpixel PX may include an emitting element and a pixel circuit.

The emitting element may emit a light due to a driving current supplied from a first transistor T1. A plurality of organic layers may be disposed between an anode and a cathode of the emitting element. The plurality of organic layers may include at least one or more of a hole transfer layer, an electron transfer layer, and an emitting layer. The hole transfer layer may be a layer that injects a hole into the emitting layer or transports a hole to the emitting layer. For example, the hole transfer layer may include a hole injection layer, a hole transport layer, and an electron blocking layer, but embodiments of the present disclosure are not limited thereto. The electron transfer layer may be layer that injects an electron into the emitting layer or transports an electron to the emitting layer. For example, the electron transfer layer may include an electron injection layer, an electron transport layer, and a hole blocking layer, but embodiments of the present disclosure are not limited thereto. The anode electrode of the emitting element may be connected to a fourth node N4, and the cathode of the emitting element may be connected to a line (or a wire) where a low potential driving voltage VSS is applied.

The first transistor T1 may control a driving current applied to the emitting element according to a source-gate voltage (Vsg) between a source electrode and a gate electrode. The first transistor T1 may be a positive (p) type MOSFET (i.e., PMOS) and may be a low temperature polycrystalline silicon (LTPS) transistor, but embodiments of the present disclosure are not limited thereto. In another embodiment of the present disclosure, the first transistor T1 may be a negative (n) type MOSFET (i.e., NMOS) and may be an oxide transistor, but embodiments of the present disclosure are not limited thereto. A source electrode of the first transistor T1 may be connected to a first node N1, a gate electrode of the first transistor T1 may be connected to a second node N2, and a drain electrode of the first transistor T1 may be connected to a third node N3. The first transistor T1 may be a driving transistor, but embodiments of the present disclosure are not limited thereto.

An n type TFT (or n type transistor) may be an oxide transistor where the semiconductor layer includes an oxide semiconductor material. For example, the oxide transistor may have a channel of an oxide semiconductor material such as indium oxide, gallium oxide, zinc oxide, or indium gallium zinc oxide (IGZO), but embodiments of the present disclosure are not limited thereto.

A p type TFT (or p type transistor) may be a polycrystalline transistor where the semiconductor layer includes a semiconductor material such as silicon. For example, the polycrystalline transistor may have a channel of an LTPS transistor through a low temperature process, but embodiments of the present disclosure are not limited thereto.

A second transistor T2 may apply a data voltage Vdata supplied from a data line DL to the first node N1 of the source electrode of the first transistor T1. For example, the second transistor may switch an electrical connection between the first node N1 of the first transistor T1 and the data line DL. The second transistor T2 may be a p type MOSFET (i.e., PMOS) and may be an LTPS transistor, but embodiments of the present disclosure are not limited thereto. In another embodiment of the present disclosure, the second transistor T2 may be an n type MOSFET (i.e., NMOS) and may be an oxide transistor, but embodiments of the present disclosure are not limited thereto. The second transistor T2 may have a source electrode connected to the data line DL, a drain electrode connected to the first node N1, and a gate electrode connected to a second scan line transmitting a second scan signal Scan2(*n*). The second transistor T2 may apply the data voltage Vdata supplied from the data line DL to the first node N1 of the source electrode of the first transistor T1 according to the second scan signal Scan2(*n*) of a low level of a turn-on voltage. The second transistor T2 may be a switching transistor, but embodiments of the present disclosure are not limited thereto.

A third transistor T3 may diode-connect a gate electrode and a drain electrode of the first transistor T1. For example, the third transistor T3 may be electrically connected between the second node N2 and the third node N3 of the first transistor T1. To minimize or reduce a leakage current during a turn-off period, the third transistor T3 may be an n type MOSFET (i.e., NMOS) and may be an oxide transistor, but embodiments of the present disclosure are not limited thereto. In another embodiment of the present disclosure, the third transistor T3 may be a p type MOSFET (i.e., PMOS) and may be an LTPS transistor, but embodiments of the present disclosure are not limited thereto. The third transistor T3 may include a drain electrode or a source electrode connected to the third node N3, a source electrode or a drain electrode connected to the second node N2, and a gate electrode connected to a first scan line transmitting a first scan signal Scan1(*n*). Accordingly, the third transistor T3 may diode-connect the gate electrode and the drain electrode of the first transistor T1 according to a high level first scan signal Scan1(*n*) which is a turn-on voltage. The third transistor T3 may be a switching transistor or a sampling transistor, but embodiments of the present disclosure are not limited thereto.

A fourth transistor T4 may apply an initialization signal (or initialization voltage) Vini(n) to the third node N3 that is the drain electrode of the first transistor T1. For example, the fourth transistor T4 may be configured to switch an electrical connection between the third node N3 of the first transistor T1 and an initialization signal line (or an initialization voltage line). The fourth transistor T4 may be a p type MOSFET (i.e., PMOS) and may be an LTPS transistor, but embodiments of the present disclosure are not limited thereto. In another embodiment, the fourth transistor T4 may be an n type MOSFET (i.e., NMOS) and may be an oxide transistor, but embodiments of the present disclosure are not limited thereto. The fourth transistor T4 may have a source electrode connected to the initialization signal line transmitting the initialization signal Vini(n), a drain electrode connected to the third node N3, and a gate electrode connected to a third scan signal line transmitting a third scan signal Scan3(*n*). Accordingly, the fourth transistor T4 may apply the initialization signal Vini(n) to the third node N3 which is the drain electrode of the first transistor T1 according to a low-level third scan signal Scan3(*n*) which is a turn-on voltage. The fourth transistor T4 may be a switching transistor or a sampling transistor, but embodiments of the present disclosure are not limited thereto.

A fifth transistor T5 may apply a high potential driving voltage VDD to the first node N1 of the source electrode of the first transistor T1. For example, the fifth transistor T5 may be configured to switch an electrical connection between the first node N1 of the first transistor T1 and the high potential driving voltage VDD. The fifth transistor T5 may be a p type MOSFET (i.e., PMOS) and may be an LTPS transistor, but embodiments of the present disclosure are not limited thereto. In another embodiment of the present disclosure, the fifth transistor T5 may be an n type MOSFET (i.e., NMOS) and may be an oxide transistor, but embodiments of the present disclosure are not limited thereto. The fifth transistor T5 may have a source electrode connected to the high potential driving voltage line transmitting the high potential driving voltage VDD, a drain electrode connected to the first node N1, and a gate electrode connected to an emission signal line transmitting an emission signal EM(n). Accordingly, the fifth transistor T5 may apply the high potential driving voltage VDD to the first node N1 of the source electrode of the first transistor T1 according to the emission signal EM(n) of a low level which is a turn-on voltage. The fifth transistor T5 may be a switching transistor, but embodiments of the present disclosure are not limited thereto.

A sixth transistor T6 may form a current path between the first transistor T1 and the emitting element. For example, the sixth transistor T6 may be configured to switch an electrical connection between the third node N3 of the first transistor T1 and a first electrode of the emitting element. The sixth transistor T6 may be a p type MOSFET (i.e., PMOS) and may be an LTPS transistor, but embodiments of the present disclosure are not limited thereto. In another embodiment, the sixth transistor T6 may be an n type MOSFET (i.e., NMOS) and may be an oxide transistor, but embodiments of the present disclosure are not limited thereto. The sixth transistor T6 may include a source electrode connected to the third node N3, a drain electrode connected to the fourth node N4, and a gate electrode connected to the emission signal line transmitting the emission signal EM(n). In response to the emission signal EM(n), the sixth transistor T6 may form a current path between the third node N3 which is the source electrode of the sixth transistor T6, and the fourth node N4 which is the drain electrode of the sixth transistor T6. Accordingly, the sixth transistor T6 may form a current path between the first transistor T1 and the emitting element according to the emission signal EM(n) of a low level which is a turn-on voltage. The sixth transistor T6 may be a switching transistor or a sampling transistor, but embodiments of the present disclosure are not limited thereto.

A seventh transistor T7 may apply a reset voltage VAR to the fourth node N4 of the anode of the emitting element. For example, the seventh transistor T7 may be configured to switch an electrical connection between the first electrode of the emitting element and a reset line where the reset voltage VAR is applied. The seventh transistor T7 may be a p type MOSFET (i.e., PMOS) and may be an LTPS transistor, but embodiments of the present disclosure are not limited thereto. In another embodiment of the present disclosure, the seventh transistor T7 may be an n type MOSFET (i.e., NMOS) and may be an oxide transistor, but embodiments of the present disclosure are not limited thereto. The seventh transistor T7 may include a source electrode connected to the reset line transmitting the reset voltage VAR, a drain electrode connected to the fourth node N4, and a gate electrode connected to the second scan signal line transmitting the third scan signal Scan3($n$+1). Accordingly the seventh transistor T7 may apply the reset voltage VAR to the fourth node N4 which is the anode of the emitting element according to the third scan signal Scan3($n$+1) that has a low level as a turn-on level and is supplied to an $(n+1)^{th}$ pixel line. The seventh transistor T7 may be a switching transistor, but embodiments of the present disclosure are not limited thereto.

The storage capacitor Cst may maintain the data voltage Vdata stored in each subpixel PX for one frame. For example, the storage capacitor Cst may be configured to apply a voltage corresponding to the data voltage Vdata to the gate electrode of the first transistor T1 for one frame period. The storage capacitor Cst may include a first electrode connected to the second node N2 and a second electrode connected to the high potential driving voltage line transmitting the high potential driving voltage VDD. For example, one electrode of the storage capacitor Cst may be connected to the gate electrode of the first transistor T1 and the other electrode of the storage capacitor Cst may be connected to the high potential driving voltage level line transmitting the high potential driving voltage VDD.

The emitting element may include a light emitting diode.

The high potential driving voltage line and the low potential driving voltage line may be a common line commonly connected to the plurality of subpixels PX in the display panel 102, but embodiments of the present disclosure are not limited thereto.

The display apparatus 1000 according to an embodiment of the present disclosure, the third transistor T3 may exemplarily be an n type, but embodiments of the present disclosure are not limited thereto. For example, the second transistor T2 may be an n type, but embodiments of the present disclosure are not limited thereto.

Figure 5:
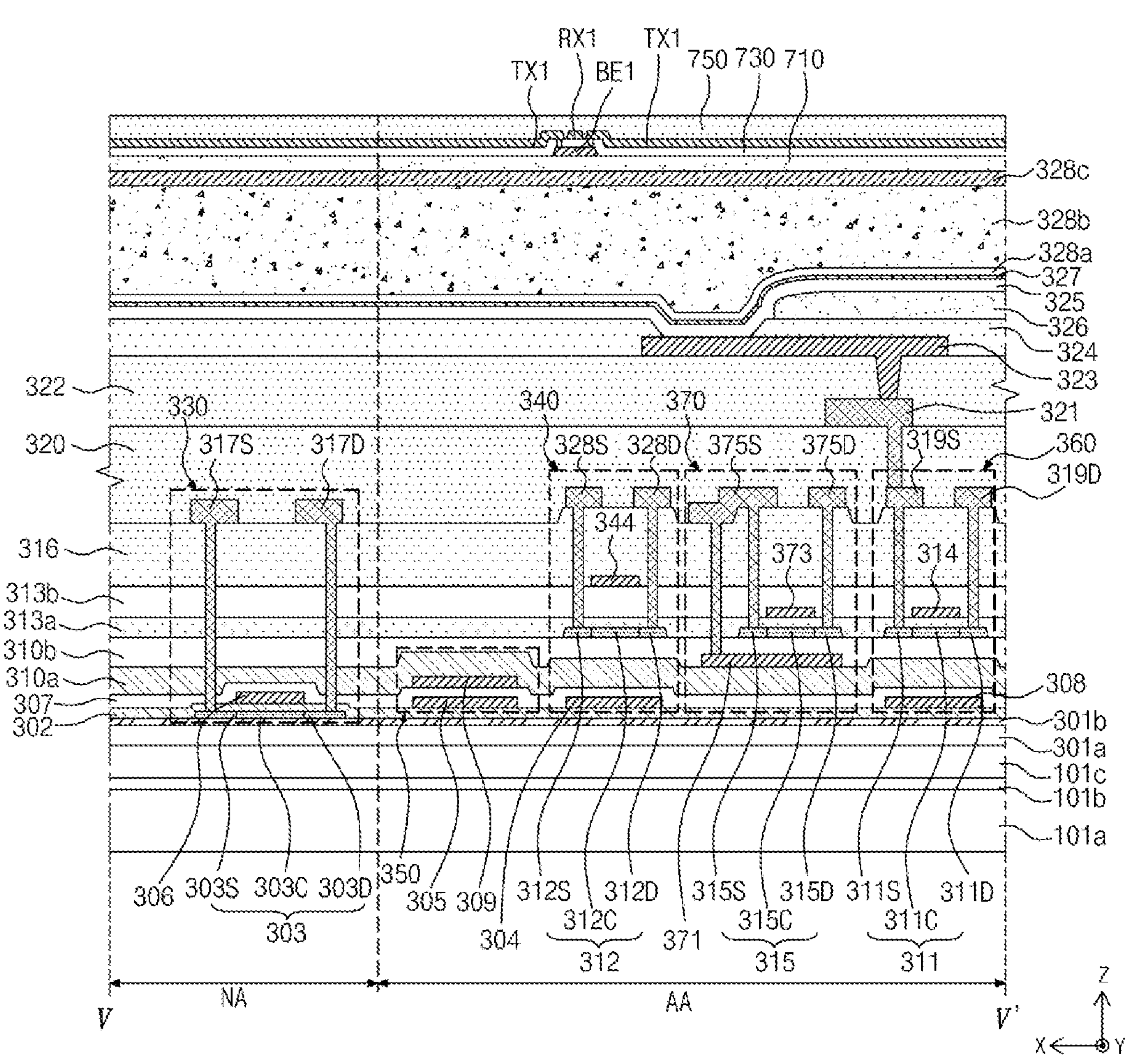
FIG. 5 is a cross-sectional view taken along a line I-I' of FIG. 1, according to an embodiment of the present disclosure.

FIG. 5 is a cross-sectional view taken along a line V-V' of FIG. 1 according to an embodiment of the present disclosure.

Referring to FIG. 5, the display apparatus 1000 according to an embodiment of the present disclosure may include the display area AA and the non-display area NA. The non-display area NA may be disposed in a periphery of the display area AA.

The display apparatus 1000 may include the gate line GL and the data line DL in the display area AA. The display apparatus 1000 may further include the subpixel PX connected to the gate line GL and the data line DL crossing the gate line GL, and the subpixel PX may include an emitting element.

The display area AA may include a first transistor 370, a second transistor 360 and a third transistor 340. The first transistor 370 may be the first transistor T1 described in FIG. 4, but embodiments of the present disclosure are not limited thereto. The second transistor 360 may be one of the second transistor T2, the fourth transistor T4, the fifth transistor T5, the sixth transistor T6 and the seventh transistor T7 described in FIG. 4, but embodiments of the present disclosure are not limited thereto. The third transistor 340 may be the third transistor T3 described in FIG. 4, but embodiments of the present disclosure are not limited thereto.

For example, the first transistor 370 may provide a driving current to the emitting element according to the data voltage supplied from the data line DL. The second transistor 360 may adjust a driving of the first transistor 370 according to the gate voltage supplied from the gate line GL. The third transistor 340 may adjust a driving of the first transistor 370 by sensing a threshold voltage of the first transistor 370 and compensating a change of the threshold voltage. For example, the third transistor 340 may adjust a driving of the first transistor 370 by sensing the threshold voltage of the first transistor 370.

A substrate 101 may be divided into the display area AA and the non-display area NA. The substrate 101 may have a multiple layer where an organic layer and an inorganic layer are alternately disposed, but embodiments of the present disclosure are not limited thereto. For example, an organic layer of polyimide (PI) and an inorganic layer of silicon oxide (SiOx) may be alternately laminated to form the substrate 101. The substrate 101 may include a first layer 101$a$ and a second layer 101$c$. The first layer 101$a$ and the second layer 101$c$ may be formed of one of polyimide (PI), polyethylene terephthalate (PET), polyethylene naphthalate (PEN), polycarbonate (PC), polyethersulfone (PES), polyarylate (PAR), polysulfone (PSF) and cyclo-olefin copolymer (COC), but embodiments of the present disclosure are not limited thereto. For example, glass may be not excluded as a material for the first layer 101$a$ and the second layer 101$c$.

The third layer 101$b$ may be disposed between the first layer 101$a$ and the second layer 101$c$. The third layer 101$b$ may include silicon oxide (SiOx) or silicon nitride (SiNx), but embodiments of the present disclosure are not limited thereto. The third layer 101$b$ may be an insulating layer or an interlayer, but is not limited to a term.

A first buffer layer 301$a$ may be disposed on the substrate 101. For example, the first buffer layer 301$a$ may block penetration moisture and the like that may permeate from the outside. The first buffer layer 301$a$ may have one or more layers, but embodiments of the present disclosure are not limited thereto. The first buffer layer 301$a$ may include silicon oxide (SiOx) or the like, but embodiments of the present disclosure are not limited thereto. For example, the first buffer layer 301$a$ may have a multiple layer of silicon oxide (SiOx) and silicon nitride (SiNx), but embodiments of the present disclosure are not limited thereto. For example, a thickness of the first buffer layer 301$a$ of silicon oxide (SiOx) may be smaller than a thickness of the first buffer layer 301$a$ of silicon nitride (SiNx). The first buffer layer 301$a$ of silicon oxide (SiOx) may have a thickness of about 500 Å, and the first buffer layer 301$a$ of silicon nitride (SiNx) may have a thickness of about 5,000 Å, but embodiments of the present disclosure are not limited thereto. The first buffer layer 301$a$ may be a multi-buffer layer, but is not limited to a term.

The second buffer layer 301$b$ may be disposed on the first buffer layer 301$a$. The second buffer layer 301$b$ may further protect the emitting element from penetration of a moisture. For example, the second buffer layer 301$b$ may have a single layer of silicon oxide (SiOx) or silicon nitride (SiNx) or a double layer of silicon oxide (SiOx) and silicon nitride (SiNx), but embodiments of the present disclosure are not limited thereto. For example, the second buffer layer 301$b$ may be an active buffer layer, but is not limited to a term.

When the first buffer layer 301$a$ includes one or more layers, the second buffer layer 301$b$ may be omitted. For example, at least one or more of the first buffer layer 301$a$ and the second buffer layer 301$b$ may be disposed on the substrate 101, but embodiments of the present disclosure are not limited thereto.

A first insulating layer 302 may be disposed on the second buffer layer 301$b$. For example, the first insulating layer 302 may include a single layer of silicon oxide (SiOx) or silicon nitride (SiNx) or a double layer of silicon oxide (SiOx) and silicon nitride (SiNx), but embodiments of the present disclosure are not limited thereto. The first insulating layer 302 may include one or more layers, but embodiments of the present disclosure are not limited thereto. The first insulating layer 302 may be a gate insulating layer, but is not limited to a term.

A second insulating layer 307 may be disposed on the first insulating layer 301. For example, when the second insulating layer 307 includes silicon oxide (SiOx) without hydrogen, at least one or more of a first semiconductor layer 315 of the first transistor 370, a second semiconductor layer 311 of the second transistor 360, and a third semiconductor layer 312 of the third transistor 340 where an oxide semiconductor material vulnerable to hydrogen is used for a semiconductor layer may be protected from hydrogen. For example, the second insulating layer 307 may include a single layer of silicon oxide (SiOx) or silicon nitride (SiNx) or a double layer of silicon oxide (SiOx) and silicon nitride (SiNx), but embodiments of the present disclosure are not limited thereto. The second insulating layer 307 may include one or more layers, but embodiments of the present disclosure are not limited thereto. The second insulating layer 307 may be an interlayer insulating layer, but is not limited to a term.

A third buffer layer 310*a* may be disposed on the second insulating layer 307. For example, when the third buffer layer 310*a* includes silicon oxide (SiOx) without hydrogen, at least one or more of the first semiconductor layer 315 of the first transistor 370, the second semiconductor layer 311 of the second transistor 360, and a third semiconductor layer 312 of the third transistor 340 where an oxide semiconductor material vulnerable to hydrogen is used for a semiconductor layer may be protected from hydrogen. For example, the third buffer layer 310*a* may include a single layer of silicon oxide (SiOx) or silicon nitride (SiNx) or a double layer of silicon oxide (SiOx) and silicon nitride (SiNx). The embodiments of the present disclosure are not limited thereto.

A fourth buffer layer 310*b* may be disposed on the third buffer layer 310*a*. For example, the fourth buffer layer 310*b* may include silicon nitride (SiNx) having an excellent ability to trap (or capture) hydrogen particles, but embodiments of the present disclosure are not limited thereto. For example, the fourth buffer layer 310*b* may include a single layer of silicon oxide (SiOx) or silicon nitride (SiNx) or a double layer of silicon oxide (SiOx) and silicon nitride (SiNx), but embodiments of the present disclosure are not limited thereto. Silicon nitride (SiNx) may have an excellent ability to trap (or capture) hydrogen particles as compared with silicon oxide (SiOx). In another embodiment of the present disclosure, at least one of the third buffer layer 310*a* and the fourth buffer layer 310*b* may be disposed on the substrate 101, but embodiments of the present disclosure are not limited thereto.

For example, the third buffer layer 310*a* and/or the fourth buffer layer 310*b* may separate the first semiconductor layer 315 of the first transistor 370 and the second semiconductor layer 311 of the second transistor 360 and may provide a base for the first semiconductor layer 315 and the second semiconductor layer 311.

A third insulating layer 313*a* may be disposed on the fourth buffer layer 310*b*. For example, the third insulating layer 313*a* may include a single layer of silicon oxide (SiOx) or silicon nitride (SiNx) or a double layer of silicon oxide (SiOx) and silicon nitride (SiNx), but embodiments of the present disclosure are not limited thereto. The third insulating layer 313*a* may be a gate insulating layer, but is not limited to a term. In an embodiment of the present disclosure, the third insulating layer 313*a* may be referred to as a first insulating layer, but embodiments of the present disclosure are not limited thereto.

According to an embodiment of the present disclosure, a transistor may be disposed in the display area AA. For example, the transistor may include a first transistor 370 and a second transistor 360. A gate driving part may be disposed in the non-display area NA.

The first transistor 370 according to an embodiment of the present disclosure may be disposed on the substrate 101. The first transistor 370 may include a first semiconductor layer 315 on the substrate 101, a third insulating layer 313*a* on the first semiconductor layer 315, a first gate electrode 373 on the third insulating layer 313*a* and a fourth insulating layer 313*b* on the first gate electrode 373.

For example, the first transistor 370 may be disposed on the buffer layer. The first transistor 370 may include the first semiconductor layer 315 and the first gate electrode 373. For example, the first semiconductor layer 315 may be an active layer, but is not limited to a term.

The first semiconductor layer 315 according to an embodiment of the present disclosure may be disposed on the buffer layer. For example, the first semiconductor layer 315 may be disposed on the fourth buffer layer 310*b*. The first semiconductor layer 315 may include an oxide semiconductor material, but embodiments of the present disclosure are not limited thereto. For example, a transistor having a semiconductor layer of an oxide semiconductor material may have an excellent leakage current blocking effect and a low fabrication cost as compared with a transistor having a semiconductor layer of a polycrystalline semiconductor material. For example, to reduce a power consumption and a fabrication cost, in an embodiment of the present disclosure, the first transistor may include an oxide semiconductor material, and at least one or more of the second transistor and the third transistor may include an oxide semiconductor material.

For example, an oxide semiconductor material may include at least one or more of an indium gallium zinc oxide (InGaZnO:IGZO)-based semiconductor material, an indium zinc oxide (InZnO:IZO)-based semiconductor material, an indium gallium zinc tin oxide (InGaZnSnO:IGZTO)-based semiconductor material, an indium tin zinc oxide (InSnZnO:ITZO)-based semiconductor material, an iron indium zinc oxide (FeInZnO:FIZO)-based semiconductor material, a zinc oxide (ZnO:ZO)-based semiconductor material, a silicon indium zinc oxide (SiInZnO:SIZO)-based semiconductor material, and a zinc oxynitride (ZnON)-based semiconductor material, but embodiments of the present disclosure are not limited thereto.

In a subpixel of another embodiment of the present disclosure, a first transistor (e.g., a driving transistor) may include an oxide semiconductor material, and some of second transistors (e.g., a switching transistor or a sampling transistor) may include an oxide semiconductor material.

The first semiconductor layer 315 may include an oxide semiconductor material. Typically, the first transistor may have a semiconductor layer of a polycrystalline semiconductor material for a high speed operation. However, in the first transistor including a polycrystalline semiconductor material, a leakage current is generated in an Off state and a power consumption increases. In an embodiment of the present disclosure, the transistor has a semiconductor layer of an oxide semiconductor material for reducing or preventing a leakage current.

In a transistor, a voltage of a source electrode may be changed due to a voltage change of a gate electrode, which may be referred to as a kick-back phenomenon. A voltage of the gate electrode may be changed due to a voltage change of a source electrode or a drain electrode. As a result, a relatively low gray level range requiring a precise current control may be deteriorated. In an embodiment of the present disclosure, a transistor having a relatively small voltage change of a source electrode due to a voltage change of a gate electrode may be provided.

The first semiconductor layer 315 may include a first channel region 315C, a first source region 315S and a first drain region 315D. The first channel region 315C may be an intrinsic region where an impurity is not doped. The first source region 315S and the first drain region 315D may include a conductive region where an impurity is doped.

The third insulating layer 313*a* may be disposed on the first semiconductor layer 315. For example, the third insulating layer 313*a* may cover the first semiconductor layer 315.

The first gate electrode 373 may be disposed on the third insulating layer 313*a*. The first gate electrode 373 may overlap the first semiconductor layer 315. For example, the first gate electrode 373 may overlap the first channel region 315C of the first semiconductor layer 315. For example, the third insulating layer 313*a* may be disposed between the first gate electrode 373 and the first semiconductor layer 315. For example, the first gate electrode 373 may be disposed between the third insulating layer 313*a* and the fourth insulating layer 313*b*.

The first gate electrode 373 may include a metallic material. For example, the first gate electrode 373 may include a single layer or a multiple layer of one of molybdenum (Mo), aluminum (Al), chromium (Cr), gold (Au), titanium (Ti), nickel (Ni), neodymium (Nd), tungsten (W), and copper (Cu), or an alloy thereof, but embodiments of the present disclosure are not limited thereto.

The second transistor 360 may be disposed on the substrate 101. The second transistor 360 according to an embodiment of the present disclosure may include a second semiconductor layer 311 on the substrate 101, a third insulating layer 313*a* on the second semiconductor layer 311, a second gate electrode 314 on the third insulating layer 313*a* and a fourth insulating layer 313*b* on the second gate electrode 314.

For example, the second transistor 360 may be disposed on the buffer layer. The second transistor 360 may include the second semiconductor layer 311 and the second gate electrode 314. For example, the second semiconductor layer 311 may be an active layer, but is not limited to a term. The second transistor 360 may be a switching transistor, for example, one or more of the fourth transistor T4, the sixth transistor T6, and the seventh transistor T7 described in FIG. 4, but embodiments of the present disclosure are not limited thereto.

The second semiconductor layer 311 according to an embodiment of the present disclosure may be disposed on the buffer layer. For example, the second semiconductor layer 311 may be disposed on the fourth buffer layer 310*b*. The second semiconductor layer 311 may include an oxide semiconductor material, but embodiments of the present disclosure are not limited thereto. For example, a transistor having a semiconductor layer of an oxide semiconductor material may have an excellent leakage current blocking effect and a low fabrication cost as compared with a transistor having a semiconductor layer of a polycrystalline semiconductor material. For example, to reduce a power consumption and a fabrication cost, the first transistor may include an oxide semiconductor material, and at least one of the second transistor and the third transistor may include an oxide semiconductor material.

The second semiconductor layer 311 may include a second channel region 311C, a second source region 311S, and a second drain region 311D. The second channel region 311C may be an intrinsic region where an impurity is not doped. The second source region 311S and the second drain region 311D may include a conductive region where an impurity is doped.

The second semiconductor layer 311 may be disposed at the same layer as the first semiconductor layer 315. For example, the second semiconductor layer 311 of the second transistor 360 may be disposed at the same layer as the first semiconductor layer 315 of the first transistor 370.

The third insulating layer 313*a* may be disposed on the second semiconductor layer 311. For example, the third insulating layer 313*a* may cover the second semiconductor layer 311.

The second gate electrode 314 may be disposed on the third insulating layer 313*a*. The second gate electrode 314 may overlap the second semiconductor layer 311. For example, the second gate electrode 314 may overlap the second channel region 311C of the second semiconductor layer 311. The third insulating layer 313*a* may be disposed between the second gate electrode 314 and the second semiconductor layer 311. The second gate electrode 314 may be disposed between the third insulating layer 313*a* and the fourth insulating layer 313*b*.

The second gate electrode 314 may be disposed at the same layer as the first gate electrode 373. For example, the second gate electrode 314 of the second transistor 306 may be disposed at the same layer as the first gate electrode 373 of the first transistor 370.

A distance between the first semiconductor layer 315 and the first gate electrode 373 may be the same as a distance between the second semiconductor layer 311 and the second gate electrode 314. For example, a distance between the first semiconductor layer 315 of the first transistor 370 and the first gate electrode 373 may be the same as a distance between the second semiconductor layer 311 of the second transistor 376 and the second gate electrode 314 of the second transistor 376.

The second gate electrode 314 may include a metallic material. For example, the second gate electrode 314 may have a single layer or a multiple layer of one of molybdenum (Mo), aluminum (Al), chromium (Cr), gold (Au), titanium (Ti), nickel (Ni), neodymium (Nd), tungsten (W), and copper (Cu), or an alloy thereof, but embodiments of the present disclosure are not limited thereto.

The display apparatus 1000 according to an embodiment of the present disclosure may further include a third transistor 340.

The third transistor 340 according to an embodiment of the present disclosure may be disposed on the substrate 101. The third transistor 340 according to an embodiment of the present disclosure may include a third semiconductor layer 312 on the substrate 101, a third insulating layer 313*a* on the third semiconductor layer 312, a fourth insulating layer 313*b* on the third insulating layer 313*a*, and a third gate electrode 344 on the fourth insulating layer 313*b*.

For example, the third transistor 340 may be disposed on the buffer layer. The third transistor 340 may include the third semiconductor layer 312 and the third gate electrode 344. For example, the third semiconductor layer 312 may be a third oxide semiconductor layer or an active layer, but is not limited to a term. The third transistor 340 may be a switching transistor or a sampling transistor, but is not limited to a term. For example, the third transistor 340 may be the third transistor T3 described in FIG. 4, but embodiments of the present disclosure are not limited thereto.

The third semiconductor layer 312 according to an embodiment of the present disclosure may be disposed on the buffer layer. For example, the third semiconductor layer 312 may be disposed on the fourth buffer layer 310*b*. The third semiconductor layer 312 may be disposed in the same layer as the first semiconductor layer 315. For example, the third semiconductor layer 312 of the third transistor 340 may be disposed at the same layer as the first semiconductor layer 315 of the first transistor 370. The third semiconductor layer 312 may be disposed at the same layer as the second semiconductor layer 311. For example, the third semiconductor layer 312 of the third transistor 340 may be disposed at the same layer as the second semiconductor layer 311 of the second transistor 360. The third semiconductor layer 312 may be disposed at the same layer as at least one of the first semiconductor layer 315 and the second semiconductor layer 311. For example, the third semiconductor layer 312 of the third transistor 340 may be disposed at the same layer as at least one of the first semiconductor layer 315 of the first transistor 370 and the second semiconductor layer 311 of the second transistor 360.

The third semiconductor layer 312 may include an oxide semiconductor material, but embodiments of the present disclosure are not limited thereto. For example, a transistor having a semiconductor layer of an oxide semiconductor material may have an excellent leakage current blocking effect and a low fabrication cost as compared with a transistor having a semiconductor layer of a polycrystalline semiconductor material. For example, to reduce a power consumption and a fabrication cost, the first transistor may include an oxide semiconductor material, and at least one or more of the second transistor and the third transistor may include an oxide semiconductor material.

The third semiconductor layer 312 may include a third channel region 312C, a third source region 312S, and a third drain region 312D. The third channel region 312C may be an intrinsic region where an impurity is not doped. The third source region 312S and the third drain region 312D may include a conductive region where an impurity is doped.

The third insulating layer 313*a* may be disposed on the third semiconductor layer 312. For example, the third insulating layer 313*a* may cover the third semiconductor layer 312.

The third gate electrode 344 may include a metallic material. For example, the third gate electrode 344 may include the same material as the first gate electrode 373 and/or the second gate electrode 314, but embodiments of the present disclosure are not limited thereto. For example, the third gate electrode 344 may include a single layer or a multiple layer of one of molybdenum (Mo), aluminum (Al), chromium (Cr), gold (Au), titanium (Ti), nickel (Ni), neodymium (Nd), tungsten (W) and copper (Cu) or an alloy thereof, but embodiments of the present disclosure are not limited thereto.

For example, a capacitance may be generated between the third semiconductor layer 312 and the third gate electrode 344. The capacitance may be a parasitic capacitance, an inner capacitance or an auxiliary capacitance, but is not limited to a term.

Since the third transistor 340 is more susceptible to a threshold voltage change than the first transistor and/or the second transistor, the capacitance between the third semiconductor layer 312 and the third gate electrode 344 may be adjusted to control the susceptibility due to the threshold voltage change. The inventors have conducted extensive research and experiments for adjust the capacitance between the third semiconductor layer 312 and the third gate electrode 344. Through extensive research and experiments, the display apparatus where the capacitance between the third semiconductor layer 312 and the third gate electrode 344 can be adjusted due to an additional insulating layer over the third insulating layer 313*a* has been invented. This is explained below.

The display apparatus 1000 according to an embodiment of the present disclosure may further include a fourth insulating layer 313*b*. The fourth insulating layer 313*b* may be disposed on the third insulating layer 313*a*. Since the fourth insulating layer 313*b* is further disposed on the third insulating layer 313*a*, the capacitance between the third semiconductor layer 312 of the third transistor 340 and the third gate electrode 344 may be reduced. Since the capacitance between the third semiconductor layer 312 and the third gate electrode 344 is reduced, the susceptibility due to the threshold voltage change of the third transistor 340 may be reduced. Further, since the capacitance between the third semiconductor layer 312 and the third gate electrode 344 is reduced, reduction in uniformity of an initial luminance may be improved and problems such as reduction in luminance may be solved. In an embodiment of the present disclosure, the fourth insulating layer 313*b* may be expressed as a second insulating layer, but embodiments of the present disclosure are not limited thereto.

The fourth insulating layer 313*b* according to an embodiment of the present disclosure may be disposed on the third insulating layer 313*a* of the first transistor 370. The third gate electrode 344 may be disposed on the fourth insulating layer 313*b*. For example, the fourth insulating layer 313*b* may be disposed between the third semiconductor layer 312 and the third gate electrode 344. The third insulating layer 313*a* and the fourth insulating layer 313*b* may be disposed between the third semiconductor layer 312 and the third gate electrode 344. The fourth insulating layer 313*b* may be disposed between the third insulating layer 313*a* and the third gate electrode 344.

Since the fourth insulating layer 313*b* is disposed over the first semiconductor layer 315 including an oxide semiconductor material, the fourth insulating layer 313*b* may include an inorganic material without hydrogen particles. For example, the fourth insulating layer 313*b* may include a single layer of silicon oxide (SiOx) or silicon nitride (SiNx) or a double layer of silicon oxide (SiOx) and silicon nitride (SiNx), but embodiments of the present disclosure are not limited thereto. The fourth insulating layer 313*b* may be a gate insulating layer, but is not limited to a term. For example, the fourth insulating layer 313*b* may have the same material as or the different material from the third insulating layer 313*a*, but embodiments of the present disclosure are not limited thereto.

According to an embodiment of the present disclosure, to enlarge a range of adjusting a gray level by the first transistor 370, a capacitance between the first semiconductor layer 315 and the first gate electrode 373 may be formed to have a relatively small value. Accordingly, the third insulating layer 313*a* may have a relatively small thickness. Further, to adjust a capacitance between the third semiconductor layer 312 and the third gate electrode 344, the third insulating layer 313*a* may be formed to have a relatively large thickness. However, when the third insulating layer 313*a* has a relatively large thickness, it is difficult to adjust an element characteristic of the first transistor 370. In an embodiment of the present disclosure, since the fourth insulating layer 313*b* is further formed on the third insulating layer 313*a*, susceptibility (or sensitivity) to the threshold voltage of the third transistor 340 may be reduced and an element characteristic of the first transistor 370 may be maintained.

According to an embodiment of the present disclosure, to adjust a capacitance between the third semiconductor layer 312 and the third gate electrode 344, a thickness of the fourth insulating layer 313*b* may be adjusted. For example, as the thickness of the third insulating layer 313*a* and/or the fourth insulating layer 313*b* between the third semiconductor layer 312 and the third gate electrode 344 increases, the capacitance between the third semiconductor layer 312 and the third gate electrode 344 may decrease. As a result, a voltage change of the third semiconductor layer 312 may be reduced. Since a capacitance between the third gate electrode 344 and the third source region 312S and a capacitance between the third gate electrode 344 and the third drain region 312D are reduced, a voltage change of the gate electrode, the source electrode and the drain electrode due to a voltage change of at least one of the gate electrode, the source electrode and the drain electrode may be reduced. Since a voltage change of the display apparatus 1000 is reduced, a performance of the display apparatus 1000 may be improved. For example, a thickness of the third insulating layer 313*a* may be different from a thickness of the fourth insulating layer 313*b*. A thickness of the third insulating layer 313*a* may be smaller than a thickness of the fourth insulating layer 313*b*. When a thickness of the third insulating layer 313*a* is different from or is smaller than a thickness of the fourth insulating layer 313*b*, a voltage change of the third semiconductor layer 312 may be improved.

According to an embodiment of the present disclosure, the third gate electrode 344 may be disposed at a different layer from the first gate electrode 373. For example, the third gate electrode 344 of the third transistor 340 may be disposed at a different layer from the first gate electrode 373 of the first transistor 370. The first gate electrode 373 may be disposed on the third insulating layer 313*a*. For example, the third gate electrode 344 may be disposed on the fourth insulating layer 313*b*.

According to an embodiment of the present disclosure, the third gate electrode 344 may be disposed at a different layer from the second gate electrode 314. For example, the third gate electrode 344 of the third transistor 340 may be disposed at a different layer from the second gate electrode 314 of the second transistor 360. The second gate electrode 314 may be disposed on the third insulating layer 313*a*. For example, the third gate electrode 344 may be disposed on the fourth insulating layer 313*b*.

The first gate electrode 373 and the second gate electrode 314 may be disposed at a different layer from the third gate electrode 344. For example, the first gate electrode 373 of the first transistor 370 and the second gate electrode 314 of the second transistor 360 may be disposed at a different layer from the third gate electrode 344 of the third transistor 340.

Since a ratio of a current change of the emitting element with respect to a threshold voltage change of the first transistor 370 and/or the third transistor 340 is greater than a ratio of a current change of the emitting element with respect to a threshold voltage change of the second transistor 360, a precise adjustment or a precise control may be required to obtain an element characteristic of a transistor. For example, since a ratio of a current change of the emitting element with respect to a threshold voltage change of the third transistor 340 is greater than a ratio of a current change of the emitting element with respect to a threshold voltage change of the first transistor 370, a precise adjustment or a precise control may be required to obtain an element characteristic of a transistor. A distance between the first semiconductor layer 315 and the first gate electrode 373 may be different from a distance between the third semiconductor layer 312 and the third gate electrode 344. For example, a distance between the first semiconductor layer 315 and the first gate electrode 373 may be smaller than a distance between the third semiconductor layer 312 and the third gate electrode 344. A distance between the first semiconductor layer 315 and the first gate electrode 373 of the first transistor 370 may be different from a distance between the third semiconductor layer 312 and the third gate electrode 344 of the third transistor 340. For example, a distance between the first semiconductor layer 315 and the first gate electrode 373 of the first transistor 370 may be smaller than a distance between the third semiconductor layer 312 and the third gate electrode 344 of the third transistor 340. A distance between the second semiconductor layer 311 and the second gate electrode 314 of the second transistor 360 may be different from a distance between the third semiconductor layer 312 and the third gate electrode 344 of the third transistor 340. For example, a distance between the second semiconductor layer 311 and the second gate electrode 314 of the second transistor 360 may be smaller than a distance between the third semiconductor layer 312 and the third gate electrode 344 of the third transistor 340. Since ratios of a current change of the emitting element with respect to a threshold voltage change of the transistors are different from each other, a current amount of the emitting element may be effectively controlled by adjusting a distance between the gate electrode and the semiconductor layer and an element characteristic of the transistor may be obtained.

Since an effective voltage applied to the third channel region 312C of the third semiconductor layer 312 is inversely proportional to a capacitance between the third semiconductor layer 312 and the third gate electrode 344, an effective voltage applied to the third semiconductor layer 312 may be controlled by adjusting a distance between the third semiconductor layer 312 and the third gate electrode 344. For example, since a capacitance between the third gate electrode 344 and the third source region 312S and a capacitance between the third gate electrode 344 and the third drain region 312D are reduced, a voltage change of other nodes may be reduced when voltages of the gate electrode, the source electrode and the drain electrode are changed.

According to an embodiment of the present disclosure, a capacitance between the third semiconductor layer 312 and the third gate electrode 344 of the third transistor 340 may be different from a capacitance between the first semiconductor layer 315 and the first gate electrode 373 of the first transistor 370. The capacitance between the third semiconductor layer 312 and the third gate electrode 344 of the third transistor 340 may be different from the capacitance between the first semiconductor layer 315 and the first gate electrode 373 of the first transistor 370. For example, a capacitance between the third semiconductor layer 312 and the third gate electrode 344 of the third transistor 340 may be smaller than a capacitance between the first semiconductor layer 315 and the first gate electrode 373 of the first transistor 370. Since a capacitance is inversely proportional to a distance between electrodes, the capacitances may be different from each other when overlap areas of the semiconductor layer and the gate electrode of the transistors are the same as each other. Accordingly, disposition (or layer) of the third gate electrode 344 may be different from disposition (or layer) of the first gate electrode 373 or disposition (or layer) of the second gate electrode 314.

According to an embodiment of the present disclosure, a capacitance between the third semiconductor layer 312 and the third gate electrode 344 of the third transistor 340 may be different from a capacitance between the second semiconductor layer 311 and the second gate electrode 314 of the second transistor 360. For example, a capacitance between the third semiconductor layer 312 and the third gate electrode 344 of the third transistor 340 may be smaller than a capacitance between the second semiconductor layer 311 and the second gate electrode 314 of the second transistor 360.

According to an embodiment of the present disclosure, a fifth insulating layer 316 may be disposed on the third gate electrode 344. The fifth insulating layer 316 may be disposed on the fourth insulating layer 313*b* of the first transistor 370 and the third transistor 340. For example, the fifth insulating layer 316 may cover the third gate electrode 344 of the third transistor 340. Since the fifth insulating layer 316 is disposed over the first semiconductor layer 315 and the second semiconductor layer 311 of an oxide semiconductor material, the fifth insulating layer 316 may include an inorganic insulating material without hydrogen particles. Since the fifth insulating layer 316 is disposed over the third semiconductor layer 312 of an oxide semiconductor material, the fifth insulating layer 316 may include an inorganic insulating material without hydrogen particles. For example, the fifth insulating layer 316 may include a single layer of silicon oxide (SiOx) or silicon nitride (SiNx) or a double layer of silicon oxide (SiOx) and silicon nitride (SiNx), but embodiments of the present disclosure are not limited thereto. The fifth insulating layer 316 may have at least one or more layers, but embodiments of the present disclosure are not limited thereto. For example, the fifth insulating layer 316 may be an interlayer insulating layer, but is not limited to a term. In an embodiment of the present disclosure, the fifth insulating layer 316 may be expressed as a third insulating layer, but embodiments of the present disclosure are not limited thereto.

The first gate electrode 373 may have a different layer from the third gate electrode 344. For example, the first gate electrode 373 may be disposed between the fourth buffer layer 310*b* and the third insulating layer 313*a*. The third gate electrode 344 may be disposed between the fourth insulating layer 313*b* and the fifth insulating layer 316.

In an embodiment of the present disclosure, source electrodes and drain electrodes may be disposed on the fifth insulating layer 316.

For example, a first source electrode 375S and a first drain electrode 375D may be disposed on the fifth insulating layer 316 of the first transistor 370. The first source electrode 375S and the first drain electrode 375D may be connected to the first source region 315S and the first drain region 315D, respectively. For example, the first source electrode 375S and the first drain electrode 375D may be connected to the first source region 315S and the first drain region 315D, respectively, through contact holes. For example, the contact holes may be formed to pass through the third insulating layer 313*a*, the fourth insulating layer 313*b* and the fifth insulating layer 316. The first source electrode 375S and the first drain electrode 375D may include a single layer or a multiple layer of one of molybdenum (Mo), aluminum (Al), chromium (Cr), gold (Au), titanium (Ti), nickel (Ni), neodymium (Nd), tungsten (W), and copper (Cu), or an alloy thereof, but embodiments of the present disclosure are not limited thereto.

For example, a second source electrode 319S and a second drain electrode 319D may be disposed on the fifth insulating layer 316 of the second transistor 360. The second source electrode 319S and the second drain electrode 319D may be connected to the second source region 311S and the second drain region 311D, respectively. For example, the second source electrode 319S and the second drain electrode 319D may be connected to the second source region 311S and the second drain region 311D, respectively, through contact holes. For example, the contact holes may be formed to pass through the third insulating layer 313*a*, the fourth insulating layer 313*b* and the fifth insulating layer 316. The second source electrode 319S and the second drain electrode 319D may include a single layer or a multiple layer of one of molybdenum (Mo), aluminum (Al), chromium (Cr), gold (Au), titanium (Ti), nickel (Ni), neodymium (Nd), tungsten (W) and copper (Cu) or an alloy thereof, but embodiments of the present disclosure are not limited thereto.

The second source electrode 319S and the second drain electrode 319D may include a same material as the first source electrode 375S and the first drain electrode 375D, but embodiments of the present disclosure are not limited thereto. For example, a number of mask processes may be reduced by simultaneously forming the second source electrode 319S and the second drain electrode 319D on the fifth insulating layer 316 with the same material as the first source electrode 375S and the first drain electrode 375D.

For example, the a third source electrode 328S and a third drain electrode 328D may be disposed on the fifth insulating layer 316 of the third transistor 340. The third source electrode 328S and the third drain electrode 328D may be connected to the third source region 312S and the third drain region 312D, respectively. For example, the third source electrode 328S and the third drain electrode 328D may be connected to the third source region 312S and the third drain region 312D, respectively, through contact holes. For example, the contact holes may be formed to pass through the third insulating layer 313*a*, the fourth insulating layer 313*b* and the fifth insulating layer 316. The third source electrode 328S and the third drain electrode 328D may include a single layer or a multiple layer of one of molybdenum (Mo), aluminum (Al), chromium (Cr), gold (Au), titanium (Ti), nickel (Ni), neodymium (Nd), tungsten (W), and copper (Cu), or an alloy thereof, but embodiments of the present disclosure are not limited thereto.

The third source electrode 328S and the third drain electrode 328D may include the same material as the first source electrode 375S and the first drain electrode 375D, but embodiments of the present disclosure are not limited thereto. The third source electrode 328S and the third drain electrode 328D may include the same material as the first source electrode 375S and the first drain electrode 375D and/or the second source electrode 319S and the second drain electrode 319D, but embodiments of the present disclosure are not limited thereto. For example, a number of mask processes may be reduced by simultaneously forming the first source electrode 375S and the first drain electrode 375D and the second source electrode 319S and the second drain electrode 319D on the fifth insulating layer 316 with the same material as each other. For example, a number of mask processes may be reduced by simultaneously forming the third source electrode 319S and the third drain electrode 319D on the fifth insulating layer 316 with the same material as the first source electrode 375S and the first drain electrode 375D and the second source electrode 319S and the second drain electrode 319D.

A source electrode and a drain electrode are classified for convenience of illustration in an embodiment of the present disclosure, and a source electrode and a drain electrode may be replaced in another embodiment of the present disclosure. For example, the source electrode may be a drain electrode and the drain electrode may be a source electrode. The source electrode of an embodiment of the present disclosure may become a drain electrode in another embodiment of the present disclosure, and the drain electrode of an embodiment of the present disclosure may become a source electrode in another embodiment of the present disclosure.

Referring to FIG. 5, the first transistor 370 may further include a fourth gate electrode 371.

The fourth gate electrode 371 may be disposed in the third buffer layer 310*a*. The fourth gate electrode 371 may be disposed between the third buffer layer 310*a* and the fourth buffer layer 310*b*. For example, the fourth gate electrode 371 may overlap the first semiconductor layer 315. The fourth gate electrode 371 may be a light shielding layer, but is not limited to a term.

For example, the fourth gate electrode 371 may be inserted into or accommodated in the third buffer layer 310*a*. For example, the fourth gate electrode 371 may be inserted between or may be accommodated by the third buffer layer 310*a* and the fourth buffer layer 310*b*. The fourth gate electrode 371 may be disposed on the third buffer layer 310*a* over the second insulating layer 307. The fourth buffer layer 310*b* may cover the fourth gate electrode 371. For example, the third buffer layer 310*a* and the fourth buffer layer 310*b* may have a sequentially laminated (or stacked) structure, but embodiments of the present disclosure are not limited thereto.

The third buffer layer 310*a* and the fourth buffer layer 310*b* may include silicon oxide (SiOx). Since the third buffer layer 310*a* and the fourth buffer layer 310*b* include silicon oxide (SiOx) without hydrogen particles, the third buffer layer 310*a* and the fourth buffer layer 310*b* may provide a base for the first transistor 370 and the second transistor 360 including an oxide semiconductor material vulnerable to hydrogen as a semiconductor layer.

The fourth gate electrode 371 according to an embodiment of the present disclosure may include a material having an excellent ability to trap hydrogen particles. For example, the fourth gate electrode 371 may include a metallic material having titanium (Ti). The fourth gate electrode 371 may have a single layer of titanium (Ti) or a multiple layer of molybdenum (Mo), titanium (Ti), an alloy of molybdenum (Mo) and titanium (Ti), or titanium nitride (TiN), but embodiments of the present disclosure are not limited thereto. For example, the fourth gate electrode 371 may include another metallic material having titanium (Ti).

Titanium (Ti) may prevent penetration of hydrogen particles to the first semiconductor layer 315 by capturing (or trapping) hydrogen particles diffused in the third buffer layer 310*a* and the fourth buffer layer 310*b*. Since the first transistor 370 according to an embodiment of the present disclosure includes the fourth gate electrode 371 includes a metallic material such as titanium (Ti) capable of capturing hydrogen particles, a problem that reliability of the oxide semiconductor layer is deteriorated by hydrogen may be solved.

The fourth gate electrode 371 according to an embodiment of the present disclosure may have a size greater than the first semiconductor layer 315 to overlap the first semiconductor layer 315. For example, the fourth gate electrode 371 may have a size greater than the first semiconductor layer 315 to completely overlap the first semiconductor layer 315.

The first source electrode 375S of the first transistor 370 may be electrically connected to the fourth gate electrode 371. For example, the first source electrode 375S may be electrically connected to the fourth gate electrode 371 through a contact hole. For example, the contact hole may be formed to pass through or in the fourth buffer layer 310*b*, the third insulating layer 313*a*, the fourth insulating layer 313*b* and the fifth insulating layer 316.

According to an embodiment of the present disclosure, since the fourth gate electrode 371 is disposed in the third buffer layer 310*a* and the first source electrode 375S is electrically connected to the fourth gate electrode 371, an effect of current increase may be obtained. Since the first transistor 370 has a dual gate structure, a current flowing through the first channel region 315C may be precisely adjusted and a size of the subpixel PX may be reduced. As a result, a display apparatus of a relatively high resolution may be obtained.

According to an embodiment of the present disclosure, since the fourth gate electrode 371 is disposed between the third buffer layer 310*a* and the fourth buffer layer 310*b*, and the first source electrode 375S is electrically connected to the fourth gate electrode 371, an effect of current increase may be obtained. Since the first transistor 370 has a dual gate structure, a current flowing through the first channel region 315C may be precisely adjusted and a size of the subpixel PX may be reduced. As a result, a display apparatus of a relatively high resolution may be obtained.

Referring to FIG. 5, the second transistor 360 may further include a fifth gate electrode 308. The fifth gate electrode 308 may be disposed under the third buffer layer 310*a*. The fifth gate electrode 308 may overlap the second semiconductor layer 311. The fifth gate electrode 308 may be disposed on the first insulating layer 302. For example, the fifth gate electrode 308 may be disposed on a top surface (or an upper surface) of the first insulating layer 302. The fifth gate electrode 308 may be a light shielding layer, but is not limited to a term.

The fifth gate electrode 308 may be disposed at a different layer from the fourth gate electrode 371. For example, the fourth gate electrode 371 may be disposed at a different layer from at least one or more of the fifth gate electrode 308 and the sixth gate electrode 304.

A distance between the fifth gate electrode 308 and the second semiconductor layer 311 may be different from a distance between the fourth gate electrode 371 and the first semiconductor layer 315. For example, a distance between the fifth gate electrode 308 and the second semiconductor layer 311 may be greater than a distance between the fourth gate electrode 371 and the first semiconductor layer 315.

A distance between the fifth gate electrode 308 and the second gate electrode 314 may be different from a distance between the fourth gate electrode 371 and the first gate electrode 373. For example, a distance between the fifth gate electrode 308 and the second gate electrode 314 may be greater than a distance between the fourth gate electrode 371 and the first gate electrode 373.

The fifth gate electrode 308 may include the same material as the fourth gate electrode 371. Since illustration on the fifth gate electrode 308 is substantially the same as illustration on the fourth gate electrode 371, illustration on the fifth gate electrode 308 may be omitted.

The fifth gate electrode 308 may be electrically connected to the second gate electrode 314. Accordingly, the second transistor 360 may have a dual gate structure or double gate structure, but is not limited to a term. Since the second transistor 360 has a dual gate (or double gate) structure, a current flowing through the second channel region 311C may be precisely adjusted and a size of the subpixel PX may be reduced. As a result, a display apparatus of a relatively high resolution may be obtained.

According to an embodiment of the present disclosure, since the fourth gate electrode 371 of the first transistor 370 is disposed closer to the first semiconductor layer 315 than the fifth gate electrode 314 of the second transistor 360, a range of controlling a gray level of the first transistor 370 may be enlarged. Since the emitting element is precisely adjusted, a display apparatus where a problem such as a stain in a relatively low gray level is solved may be obtained.

Referring to FIG. 5, the third transistor 340 may further include a sixth gate electrode 304. The sixth gate electrode 304 may be disposed under the third buffer layer 310*a*. The sixth gate electrode 304 may overlap the third semiconductor layer 312. The sixth gate electrode 304 may be disposed on the first insulating layer 302. For example, the sixth gate electrode 304 may be disposed on a top surface (or an upper surface) of the first insulating layer 302. The sixth gate electrode 308 may be a light shielding layer, but is not limited to a term.

The sixth gate electrode 304 may be disposed at a different layer from the fourth gate electrode 371. For example, the sixth gate electrode 304 may be disposed at the same layer as the fifth gate electrode 308. The fourth gate electrode 371 may be disposed at a different layer from at least one or more of the fifth gate electrode 308 and the sixth gate electrode 304.

The sixth gate electrode 304 may include the same material as the fourth gate electrode 371. Since illustration on the sixth gate electrode 304 is substantially the same as illustration on the fourth gate electrode 371, illustration on the sixth gate electrode 304 may be omitted.

A distance between the sixth gate electrode 304 and the third semiconductor layer 312 may be different from a distance between the fourth gate electrode 371 and the first semiconductor layer 315. For example, a distance between the sixth gate electrode 304 and the third semiconductor layer 312 may be greater than a distance between the fourth gate electrode 371 and the first semiconductor layer 315.

A distance between the fifth gate electrode 308 and the second semiconductor layer 311 may be the same as a distance between the sixth gate electrode 304 and the third semiconductor layer 312.

A distance between the sixth gate electrode 304 and the third gate electrode 344 may be different from a distance between the fourth gate electrode 371 and the first gate electrode 373. For example, a distance between the sixth gate electrode 304 and the third gate electrode 344 may be greater than a distance between the fourth gate electrode 371 and the first gate electrode 373.

A distance between the fifth gate electrode 308 and the second gate electrode 314 may be different from a distance between the sixth gate electrode 304 and the third gate electrode 344. For example, a distance between the fifth gate electrode 308 and the second gate electrode 314 may be greater than a distance between the sixth gate electrode 304 and the third gate electrode 344.

The sixth gate electrode 304 may be electrically connected to the third gate electrode 344. Accordingly, the third transistor 340 may have a dual gate structure or a dual gate structure, but is not limited to a term. Since the third transistor 340 has a dual gate (or double gate) structure, a current flowing through the third channel region 312C may be precisely adjusted and a size of the subpixel PX may be reduced. As a result, a display apparatus of a relatively high resolution may be obtained.

Referring to FIG. 5, the display apparatus 1000 according to an embodiment of the present disclosure may further include a storage capacitor 350. The storage capacitor 350 may be disposed in the display area AA.

The storage capacitor 350 may store the data voltage applied through the data line for a certain period and then provide the data voltage to the emitting element.

The storage capacitor 350 may include corresponding two electrodes and a dielectric layer between the two electrodes. The storage capacitor 350 may include a first storage electrode 305 and a second storage electrode 309. For example, the first storage electrode 350 may be a first capacitor electrode, but is not limited to a term. For example, the second storage electrode 309 may be a second capacitor electrode, but is not limited to a term.

The first storage electrode 305 may be formed of the same material in the same layer as the sixth gate electrode 304.

The second insulating layer 307 may be disposed between the first storage electrode 305 and the second storage electrode 309. The first storage electrode 305 may be electrically connected to the third source electrode 328S.

The third buffer layer 310*a* and the fourth buffer layer 310*b* may be disposed on the second storage electrode 309. The third insulating layer 313*a* and the fourth insulating layer 313*b* may be disposed on the fourth buffer layer 310*b*. The fifth insulating layer 316 may be disposed on the fourth insulating layer 313*b*. Since illustration on the third buffer layer 310*a*, the fourth buffer layer 310*b*, the third insulating layer 313*a*, the fourth insulating layer 313*b* and the fifth insulating layer 316 is substantially the same as the above illustration, detailed illustration may be omitted.

Referring to FIG. 5, the gate driving part may be disposed in the non-display area NA. The gate driving part may be a driver including a gate in panel (GIP) circuit. For example, the gate driving part may be a GIP type, but embodiments of the present disclosure are not limited thereto.

A fourth transistor 330 may be disposed on the substrate 101. The fourth transistor 330 may be a switching transistor, but is not limited to a term.

The fourth transistor 330 may be disposed in the non-display area NA. The fourth transistor 330 may apply a gate voltage to the second transistor 360 and the third transistor 340.

The fourth transistor 330 may include a fourth semiconductor layer 303 and a seventh gate electrode 306.

The fourth semiconductor layer 303 may be formed as a polycrystalline semiconductor layer. The fourth semiconductor layer 303 may include a channel where an electron and a hole move. The fourth semiconductor layer 303 may be an active layer, but is not limited to a term.

The fourth semiconductor layer 303 may have a fourth channel region 303C, a fourth source region 303S, and a fourth drain region 303D. The fourth channel region 303C may be disposed between the fourth source region 303S and the fourth drain region 303D.

The fourth source region 303S and the fourth drain region 303D may include a conductive region having an intrinsic polycrystalline semiconductor material doped with an impurity of V or III group such as phosphor (P) or boron (B) at a predetermined concentration. The fourth channel region

303C may include an intrinsic polycrystalline semiconductor material to provide a path for an electron or a hole.

According to another embodiment of the present disclosure, the fourth semiconductor layer 303 may include an oxide semiconductor layer. When the fourth semiconductor layer 303 includes an oxide semiconductor layer, the transistors in the non-display area NA and the display area AA may be simultaneously formed through the same process by the same semiconductor material. As a result, a fabrication process may be simplified. For example, since the first semiconductor layer 315, the second semiconductor layer 311, the third semiconductor layer 312 and the fourth semiconductor layer 303 include an oxide semiconductor material, the first semiconductor layer 315, the second semiconductor layer 311, the third semiconductor layer 312 and the fourth semiconductor layer 303 may be simultaneously formed through the same process. As a result, a fabrication process may be simplified.

The seventh gate electrode 306 of the fourth transistor 330 may overlap the fourth channel region 303C of the fourth semiconductor layer 303. The first insulating layer 302 may be disposed between the seventh gate electrode 306 and the fourth semiconductor layer 303. For example, the seventh gate electrode 306 may be a fourth gate electrode, but embodiments of the present disclosure are not limited thereto.

The fourth transistor 330 according to an embodiment of the present disclosure may have a top gate structure where the seventh gate electrode 306 is disposed on the fourth semiconductor layer 303. Since the first storage electrode 305, the fifth gate electrode 308, and the sixth gate electrode 304 formed of a material forming the seventh gate electrode 306 are formed through a single mask process, a number of mask processes may be reduced. The seventh gate electrode 306 may be disposed at the same layer as the fifth gate electrode 308. For example, the seventh gate electrode 306 may be disposed at the same layer as the sixth gate electrode 304. The seventh gate electrode 306 may be disposed at the same layer as the first storage electrode 305. The seventh gate electrode 306 may be disposed at the same layer as at least one or more of the first storage electrode 305, the fifth gate electrode 308 and the sixth gate electrode 304.

The seventh gate electrode 306 may include a metallic material. For example, the seventh gate electrode 306 may have a single layer or a multiple layer of one of molybdenum (Mo), aluminum (Al), chromium (Cr), gold (Au), titanium (Ti), nickel (Ni), neodymium (Nd), tungsten (W) and copper (Cu) or an alloy thereof, but embodiments of the present disclosure are not limited thereto.

The second insulating layer 307 may be disposed on the seventh gate electrode 306. The second insulating layer 307 may include silicon nitride (SiNx). For example, the second insulating layer 307 of silicon nitride (SiNx) may include hydrogen particles. After the fourth semiconductor layer 303 is formed and the second insulating layer 307 is formed on the fourth semiconductor layer 303, a heat treatment is performed. During the heat treatment, hydrogen in the second insulating layer 307 may diffused into the fourth source region 303S and the fourth drain region 303D to increase conductivity of the polycrystalline semiconductor material and stabilize the polycrystalline semiconductor material. The heat treatment may be referred to as a hydrogenation process.

In the fourth transistor 330, the third buffer layer 310*a*, the fourth buffer layer 310*b*, the third insulating layer 313*a*, the fourth insulating layer 313*b*, and the fifth insulating layer 316 may be disposed on the second insulating layer 307. Since illustration on the third buffer layer 310*a*, the fourth buffer layer 310*b*, the third insulating layer 313*a*, the fourth insulating layer 313*b*, and the fifth insulating layer 316 is substantially the same as the above illustration, detailed illustration may be omitted.

The fourth source electrode 317S and the fourth drain electrode 317D may be disposed on the fifth insulating layer 316. The fourth source electrode 317S and the fourth drain electrode 317D may be connected to the fourth source region 303S and the fourth drain region 303D, respectively. For example, the fourth source electrode 317S and the fourth drain electrode 317D may be connected to the fourth source region 303S and the fourth drain region 303D, respectively, through contact holes. The contact holes may be formed in or to pass through the second insulating layer 307, the third buffer layer 310*a*, the fourth buffer layer 310*b*, the third insulating layer 313*a*, the fourth insulating layer 313*b*, and the fifth insulating layer 316.

Referring to FIG. 5, the display apparatus 1000 according to an embodiment of the present disclosure may further include a first passivation layer 320 and a second passivation layer 322.

The first passivation layer 320 may be disposed on the first transistor 370, the second transistor 360, the third transistor 340, and the fourth transistor 330. For example, the first passivation layer 320 may be disposed on the first source electrode 375S, the first drain electrode 375D, the second source electrode 319S, the second drain electrode 319D, the third source electrode 328S, the third drain electrode 328D, the fourth source electrode 317S, and the fourth drain electrode 317D.

For example, the first passivation layer 320 may planarize a top surface (or an upper surface) of the first transistor 370, the second transistor 360, the third transistor 340, and the fourth transistor 330.

The second passivation layer 322 may be disposed on the first passivation layer 320. The first passivation layer 320 and the second passivation layer 322 may include an organic material such as polyimide and acrylic resin, but embodiments of the present disclosure are not limited thereto. The first passivation layer 320 may be a first planarizing layer, but is not limited to a term. The second passivation layer 322 may be a second planarizing layer, but is not limited to a term.

The display apparatus 1000 according to an embodiment of the present disclosure may include the first buffer layer on the substrate 101, the first insulating layer on the first buffer layer, the second buffer layer on the first insulating layer, and the first semiconductor layer, the second semiconductor layer and the third semiconductor layer on the second buffer layer. The display apparatus 1000 may further include the third insulating layer on the first semiconductor layer, the second semiconductor layer and the third semiconductor layer, and the first gate electrode and the second gate electrode on the third insulating layer. The display apparatus 1000 may further include the fourth insulating layer on the first gate electrode and the second gate electrode, and the third gate electrode on the fourth insulating layer. The display apparatus 1000 may further include the fifth insulating layer on the third gate electrode, the first source electrode, the first drain electrode, the second source electrode, the second drain electrode, the third source electrode and the third drain electrode on the fifth insulating layer.

According to an embodiment of the present disclosure, the first semiconductor layer, the second semiconductor layer and the third semiconductor layer may be disposed at the same layer. The first gate electrode and the second gate electrode may be disposed at the same layer. The first gate electrode may be disposed at a different layer from the third gate electrode. The second gate electrode may be disposed at a different layer from the third gate electrode. The thickness of the first insulating layer may be different from the thickness of the second insulating layer.

According to an embodiment of the present disclosure, the first semiconductor layer, the first gate electrode, the first source electrode and the first drain electrode may constitute the first transistor. The second semiconductor layer, the second gate electrode, the second source electrode and the second drain electrode may constitute the second transistor. The third semiconductor layer, the third gate electrode, the third source electrode, and the third drain electrode may constitute the third transistor.

According to an embodiment of the present disclosure, the distance between the first semiconductor layer and the first gate electrode may be different from the distance between the third semiconductor layer and the third gate electrode. The distance between the second semiconductor layer and the second gate electrode may be different from the distance between the third semiconductor layer and the third gate electrode. The capacitance between the third semiconductor layer and the third gate electrode may be different from the capacitance between the first semiconductor layer and the first gate electrode. The capacitance between the third semiconductor layer and the third gate electrode may be different from the capacitance between the second semiconductor layer and the second gate electrode.

Referring to FIG. 5, an emitting element part or an emitting element layer may be disposed on the second passivation layer 322. The emitting element part or the emitting element layer may include a first electrode 323, a second electrode 327, and an emitting element 325.

The first electrode 323 may be an anode. The first electrode 323 may be disposed in each subpixel PX. The first electrode 323 may have a multiple layer of a transparent conductive layer and an opaque conductive layer having a relatively high reflectance. The transparent conductive layer may include a material having a relatively high work function such as indium tin oxide (ITO) and indium zinc oxide (IZO), but embodiments of the present disclosure are not limited thereto. The opaque conductive layer may have a single layer or a multiple layer of aluminum (Al), silver (Ag), copper (Cu), lead (Pb), molybdenum (Mo), titanium (Ti) and an alloy thereof, but embodiments of the present disclosure are not limited thereto. For example, the first electrode 323 may have a structure where the transparent conductive layer, the opaque conductive layer and the transparent conductive layer are sequentially disposed or a structure where the transparent conductive layer and the opaque conductive layer are sequentially disposed, but embodiments of the present disclosure are not limited thereto.

When the display apparatus 1000 is a top emission type, the first electrode 323 may include an opaque conductive material as a reflective electrode reflecting a light. For example, the first electrode (anode) 323 may include at least one or more of silver (Ag), aluminum (Al), gold (Au), molybdenum (Mo), tungsten (W), chromium (Cr) and an alloy thereof. but embodiments of the present disclosure are not limited thereto. For example, the first electrode 323 may have a triple layer of silver/palladium/copper (Ag/Pd/Cu), but embodiments of the present disclosure are not limited thereto.

When the display apparatus 1000 is a bottom emission type, the first electrode 323 may include a transparent conductive material as a transparent electrode transmitting a light. For example, the first electrode (anode) 323 may include at least one or more of indium zinc oxide (ITO) and indium zinc oxide (IZO), but embodiments of the present disclosure are not limited thereto.

The second electrode 327 may be a cathode. For example, the second electrode 327 may face into the first electrode 323 and the emitting element 325 may be interposed between the first electrode 323 and the second electrode 327. The second electrode 327 may be disposed on a top surface (or an upper surface) and a side surface of the emitting element 325. When the display apparatus 1000 has a top emission type, the second electrode 327 may include a transparent conductive material transmitting a light. For example, the second electrode 327 may include at least one or more of indium tin oxide (ITO) and indium zinc oxide (IZO), but embodiments of the present disclosure are not limited thereto.

In another embodiment of the present disclosure, the second electrode 327 may include a half-transmissive conductive material. For example, the second electrode 327 may include at least one of alloys such as LiF/Al, CsF/Al, Mg:Ag, Ca/Ag, Ca:Ag, LiF/Mg:Ag, LiF/Ca/Ag and LiF/Ca:Ag.

When the display apparatus 1000 has a bottom emission type, the second electrode 327 may include an opaque conductive material as a reflective electrode reflecting a light. For example, the second electrode **327*b*** may include at least one or more of silver (Ag), aluminum (Al), gold (Au), molybdenum (Mo), tungsten (W), chromium (Cr) and an alloy thereof, but embodiments of the present disclosure are not limited thereto.

The emitting element 325 may be disposed between the first electrode 323 and the second electrode 327. The emitting element 325 may have a hole transfer layer, an emitting layer, an electron transfer layer sequentially disposed or inversely sequentially disposed on the first electrode 323. The hole transfer layer may inject a hole into the emitting layer or may transport a hole to the emitting layer. For example, the hole transfer layer may include a hole injection layer, a hole transport layer, and an electron blocking layer, but embodiments of the present disclosure are not limited thereto. The electron transfer layer may inject an electron into the emitting 1 layer or may transport an electron to the emitting layer. For example, the electron transfer layer may include an electron injection layer, an electron transport layer and a hole blocking layer, but embodiments of the present disclosure are not limited thereto.

The emitting element may include one emitting part. The one emitting part may have a red emitting layer, a green emitting layer and a blue emitting layer emitting a red colored light, a green colored light and a blue colored light, respectively, in each subpixel PX.

The emitting element may include at least two or more emitting parts. The emitting part may be referred to as a stack, but embodiments of the present disclosure are not limited thereto. The at least or more two emitting parts may include a first emitting part and a second emitting part. The first emitting part and the second emitting part may have a red emitting layer, a green emitting layer, and a blue emitting layer emitting a red colored light, a green colored light, and a blue colored light, respectively, in each subpixel PX. At least two or more emitting layers in the first emitting part and the second emitting part may emit the same colored light. In another embodiment of the present disclosure, a first emitting layer of the first emitting part may include blue, sky blue, deep blue, blue and red emitting layers, sky blue and red emitting layers or deep blue and red emitting layers, but embodiments of the present disclosure are not limited thereto. A second emitting layer of the second emitting part may include a yellow emitting layer, a yellow green emitting layer, a green emitting layer, yellow and red emitting layers, yellow green and red emitting layers, green and red emitting layers, a combination of yellow, yellow green and green emitting layers, a combination of yellow, yellow green, green and red emitting layers, a combination of two yellow green and one green emitting layers, a combination of one yellow green and two green emitting layers, a combination of two yellow green, one green and red emitting layers or a combination of one yellow green, two green and red emitting layers. The embodiments of the present disclosure are not limited thereto. A charge generating layer may be disposed between the first emitting part and the second emitting part. The charge generating layer may include an n-type charge generating layer and a p-type charge generating layer. Each of the first emitting part and the second emitting part may include at least one or more of a hole injection layer, a hole transport layer, a hole blocking layer, an electron blocking layer, an electron transport layer, and an electron injection layer, but embodiments of the present disclosure are not limited thereto.

The at least two or more emitting parts may include a first emitting part, a second emitting part and a third emitting part. A first emitting layer of the first emitting part may have the same structure as the above first emitting layer. A second emitting layer of the second emitting part may have the same structure as the above second emitting layer. A third emitting layer of the third emitting part may have the same structure as the first emitting layer of the first emitting part, but embodiments of the present disclosure are not limited thereto. A first charge generating layer may be disposed between the first emitting part and the second emitting part. The first charge generating layer may include an n type charge generating layer and a p type charge generating layer. A second charge generating layer may be disposed between the second emitting part and the third emitting part. The second charge generating layer may include an n-type charge generating layer and a p-type charge generating layer. Each of the first emitting part, the second emitting part and the third emitting part may include at least one or more of a hole injection layer, a hole transport layer, a hole blocking layer, an electron blocking layer, an electron transport layer and an electron injection layer, but embodiments of the present disclosure are not limited thereto.

The at least two or more emitting parts may include a first emitting part, a second emitting part, a third emitting part, and a fourth emitting part. At least two or more emitting layers among the first emitting part, the second emitting part, the third emitting part, and the fourth emitting part may include emitting layers emitting the same colored light. For example, at least two or more emitting layers among the first emitting part, the second emitting part, the third emitting part, and the fourth emitting part may include a blue emitting layer, but embodiments of the present disclosure are not limited thereto. At least one or more emitting layers among the first emitting part, the second emitting part, the third emitting part, and the fourth emitting part may include emitting layers different from a blue emitting layer. For example, at least one or more emitting layers of the first emitting part, the second emitting part, the third emitting part, and the fourth emitting part may include a yellow emitting layer, a yellow green emitting layer, a green emitting layer, yellow and red emitting layers, yellow green and red emitting layers, green and red emitting layers, a combination of yellow, yellow green and green emitting layers, a combination of yellow, yellow green, green and red emitting layers, a combination of two yellow green and one green emitting layers, a combination of one yellow green and two green emitting layers, a combination of two yellow green, one green and red emitting layers or a combination of one yellow green, two green and red emitting layers. The embodiments of the present disclosure are not limited thereto. A first charge generating layer may be disposed between the first emitting part and the second emitting part. The first charge generating layer may include an n-type charge generating layer and a p-type charge generating layer. A second charge generating layer may be disposed between the second emitting part and the third emitting part. The second charge generating layer may include an n-type charge generating layer and a p-type charge generating layer. A third charge generating layer may be disposed between the third emitting part and the fourth emitting part. The third charge generating layer may include an n-type charge generating layer and a p-type charge generating layer. Each of the first emitting part, the second emitting part, the third emitting part, and the fourth emitting part may include at least one or more of a hole injection layer, a hole transport layer, a hole blocking layer, an electron blocking layer, an electron transport layer, and an electron injection layer. The embodiments of the present disclosure are not limited thereto.

A connecting electrode 321 may be disposed on the first passivation layer 320. The emitting element part may be connected to the transistor through the connecting electrode 321. For example, the first electrode 323 and the second source electrode 319S of the second transistor 360 may be connected to each other through the connecting electrode 321.

The first electrode 323 may be connected to the connecting electrode 321 through a contact hole in the second passivation layer 322. The connecting electrode 321 may be connected to the second source electrode 319S through a contact hole in the first passivation layer 320.

A bank layer 324 may expose the first electrode 323 in each subpixel PX. The bank layer 324 may divide the plurality of subpixels PX. The bank layer 324 may be referred to as a pixel defining layer. The bank layer 324 may minimize a light spread and may prevent a light interference between the adjacent subpixels PX. The bank layer 324 may prevent a color mixing along various viewing angles. The bank layer 324 may include an opaque material having a black color. For example, the bank layer 324 may include a light shielding material having at least one of a color pigment, an organic black and a carbon, but embodiments of the present disclosure are not limited thereto. For example, the bank layer 324 may include at least one of an inorganic insulating material such as silicon nitride (SiNx) and silicon oxide (SiOx) and an organic insulating material such as benzocyclobutene (BCB), acrylic resin, epoxy resin, phenolic resin, polyamide resin and polyimide resin, but embodiments of the present disclosure are not limited thereto.

A spacer 326 may be further disposed on the bank layer 324. The spacer 326 may minimize breakage of the display apparatus 1000 due to an external impact by buffering a space between the substrate 101 having the emitting element and an upper substrate. The spacer 326 may include the same material as the bank layer 324 and may be simultaneously formed with the bank layer 324, but embodiments of the present disclosure are not limited thereto.

The emitting element 325 may be disposed on the first electrode 323, the bank layer 324 and the spacer 326. The emitting element 325 may include at least one or more of a red emitting layer, a green emitting layer, a blue emitting layer, and a white emitting layer for emitting a specific colored light. When the emitting element 325 includes a white emitting layer, a color filter layer may be disposed on the emitting element 325 for converting a white colored light into a different colored light. For example, a color filter layer may be disposed on a touch part, but embodiments of the present disclosure are not limited thereto. In another embodiment of the present disclosure, a color filter layer may be disposed between the touch part and the encapsulation part, but embodiments of the present disclosure are not limited thereto. For example, a light emitted from the emitting element 325 toward the encapsulation part to display an image through the color filter layer. The color filter layer may include red, green and blue color filters, but embodiments of the present disclosure are not limited thereto. For example, a light emitted from the emitting element 325 may display an image through the red, green, and blue color filters.

An encapsulation part may be further disposed on the second electrode 327. The encapsulation part may prevent penetration of an oxygen or a moisture.

The encapsulation part may include a first encapsulating layer 328*a*, a second encapsulating layer 328*b* and a third encapsulating layer 328*c*, but embodiments of the present disclosure are not limited thereto. For example, the encapsulation part may include at least two or more layers, but embodiments of the present disclosure are not limited thereto. For example, the encapsulation part may have an inclined surface at a periphery of the display area AA or in the non-display area NA.

The first encapsulating layer 328*a* and the third encapsulating layer 328*c* may include at least one or more of silicon oxide (SiOx), silicon nitride (SiNx) and aluminum oxide (AlyOz), but embodiments of the present disclosure are not limited thereto.

The second encapsulating layer 328*b* may cover foreign substances or a particle generated during a fabrication process. The second encapsulating layer 328*b* may planarize a surface of the first encapsulating layer 328*a*. For example, the second encapsulating layer 328*b* may include at least one or more of acrylic resin, epoxy resin, phenolic resin, polyamide resin, polyimide resin, silicon oxycarbon (SiOCz) and polyethylene, but embodiments of the present disclosure are not limited thereto. The first encapsulating layer 328*a*, the second encapsulating layer 328*b*, and the third encapsulating layer 328*c* may be sequentially disposed on the second electrode 327, but embodiments of the present disclosure are not limited thereto. For example, the first encapsulating layer 328*a* of an inorganic material, the second encapsulating layer 328*b* of an organic material and the third encapsulating layer 328*c* of an inorganic material may be sequentially disposed on the second electrode 327, but embodiments of the present disclosure are not limited thereto.

Referring to FIG. 5, a touch part may be further disposed on the encapsulation part. For example, the touch part for sensing a touch of a user may be disposed on the encapsulation part. Since illustration on the touch part is substantially the same as illustration relating to FIGS. 2 and 3, the same part may be designated by the same reference number and illustration may be omitted or simplified. The touch part may be illustrated with reference to FIGS. 2 and 3.

A fifth buffer layer 710 may be disposed on the third encapsulating layer 328*c* of the encapsulation part. The fifth buffer layer 710 may block penetration of a solution (a developer or an etchant) used in a fabrication process of the touch part or a moisture from an exterior into the emitting element 325 having an organic material. In addition, a disconnection of a plurality of touch sensors on the fifth buffer layer 710 due to an external impact may be prevented, and an interference signal generated during operation of the touch part may be prevented. The fifth buffer layer 710 may be referred to as a touch buffer layer, but is not limited to a term.

The fifth buffer layer 710 may include a single layer or a multiple layer of one of silicon oxide (SiOx) and silicon nitride (SiNx), but embodiments of the present disclosure are not limited thereto. In another embodiment, the fifth buffer layer 710 may include acrylic resin, epoxy resin, phenolic resin, polyamide resin, polyimide resin or the like, but embodiments of the present disclosure are not limited thereto.

The touch part may include a sixth insulating layer 730, a touch electrode part and a third passivation layer 750. For example, the sixth insulating layer 730 may be a touch insulating layer, a lower insulating layer or a lower touch insulating layer, but embodiments of the present disclosure are not limited thereto. For example, the third passivation layer 750 may be a touch insulating layer, an upper insulating layer or an upper touch insulating layer, but embodiments of the present disclosure are not limited thereto.

The touch electrode part may include a plurality of touch electrodes for sensing a touch of a user. The plurality of touch electrodes may function as a touch sensor for sensing a touch of a user according to a mutual capacitance type or a self capacitance type. The touch electrode part may include a plurality of first touch electrode channels TX1 disposed along a first direction and a plurality of second touch electrode channels RX1 disposed along a second direction perpendicular to the first direction on the same plane. The plurality of first touch electrode channels TX1 may be an electrode for transmitting a touch signal or a touch transmitting electrode, and the plurality of second touch electrode channels RX1 may be an electrode for receiving a touch signal or a touch receiving electrode, but are not limited to a term.

The touch electrode part according to an embodiment of the present disclosure may be formed as a touch panel including a plurality of touch electrodes. For example, an add-on type touch panel may be disposed on or combined with the encapsulation part or an optical film when the emitting element has a top emission structure and may be disposed on or combined with a rear surface of the substrate when the emitting element has a bottom emission structure.

In another embodiment of the present disclosure, the touch electrode part may be formed directly on the encapsulation part according to an in-cell type. For example, an in-cell type touch electrode part may be formed directly on a front surface of the encapsulation part when the emitting element has a top emission structure. The embodiments of the present disclosure are not limited thereto.

A first connecting electrode BE1 may be disposed on the fifth buffer layer 710. For example, the first connecting electrode BE1 may connect the plurality of first touch electrode channels TX1. For example, the first connecting electrode BE1 may electrically connect each of the plurality of touch electrode channels TX1 and RX1 to each other by being disposed on different planes. The first connecting electrode BE1 may be referred to as a touch electrode connecting line, a touch bridge electrode or a touch bridge line, but is not limited to a term.

For example, the first connecting electrode BE1 may be disposed between the plurality of first touch electrode channels TX1 adjacent along a first direction (or X axis direction). For example, the first connecting electrode BE1 may electrically connect first touch electrodes connected to the plurality of first touch electrode channels TX1 spaced apart from each other along the first direction (or X direction) and disposed adjacent to each other, but embodiments of the present disclosure are not limited thereto.

A sixth insulating layer 730 may be disposed on the fifth buffer layer 710 and the first connecting electrode BE1. The sixth insulating layer 730 may have a hole for connecting the first touch electrode channel TX1 and the first connecting electrode BE1 electrically. Accordingly, the sixth insulating layer 730 may electrically insulate the first touch electrode channel TX1 and the connecting electrode BE1.

The sixth insulating layer 730 may include a single layer or a multiple layer of silicon nitride (SiNx) or silicon oxide (SiOx), but embodiments of the present disclosure are not limited thereto.

The first touch electrode channel TX1 and the second touch electrode channel RX1 may be disposed on the sixth insulating layer 730.

The first touch electrode channel TX1 and the second touch electrode channel RX1 may be disposed to be spaced apart from each other by a predetermined interval. At least one or more of first touch electrode channels TX1 adjacent to each other along the first direction (or X axis direction) may be disposed to be spaced apart from each other. Each of the at least one or more of first touch electrode channels TX1 adjacent to each other along the first direction (or X axis direction) may be connected to the first connecting electrode BEL For example, each of the first touch electrode channels TX1 adjacent to each other along the first direction (or X axis direction) may be connected to the first connecting electrode BE1 through a hole in the sixth insulating layer 730.

At least two second touch electrode channels RX1 adjacent to each other along a second direction (Y axis direction) may be connected to each other through a second connecting electrode BE2.

A third passivation layer 750 may be disposed on the first touch electrode channel TX1 and the second touch electrode channel RX1.

The third passivation layer 750 may be disposed to cover the sixth insulating layer 730, the first touch electrode channel TX1, and the second touch electrode channel RX1.

The third passivation layer 750 may include at least one or more of benzocyclobutene (BCB), acrylic resin, epoxy resin, phenolic resin, polyamide resin, and polyimide resin, but embodiments of the present disclosure are not limited thereto. The third passivation layer 750 may be referred to as a planarizing layer or an insulating layer, but is not limited to a term.

To apply an electric signal to the touch electrode part of the touch part in the display area AA, a touch line may be disposed in the non-display area NA. The touch line may be referred to as a touch connecting line or a touch routing line, but is not limited to a term.

A touch driving circuit may transmit a touch driving signal to the first touch electrode channel TX1 and may receive a touch sensing signal from the second touch electrode channel RX1. The touch driving circuit may sense a touch of a user by a mutual capacitance between a first touch electrode connected to the first touch electrode channel TX1 and a second electrode connected to the second touch electrode channel RX1. For example, when a touch is added to the display apparatus 1000, a capacitance between the first touch electrode and the second touch electrode may be changed. The touch driving circuit may detect a touch coordinate by sensing a capacitance change.

Figure 6A:
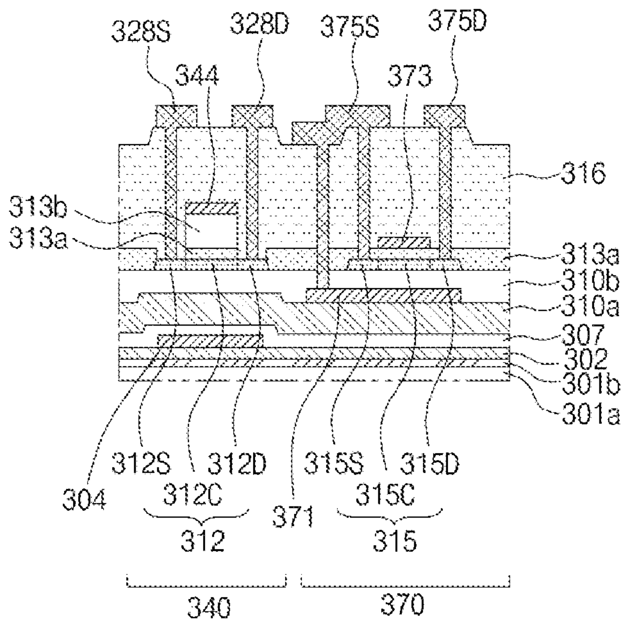
FIG. 6A is a cross-sectional view showing a display apparatus, according to another embodiment of the present disclosure.
Figure 6B:
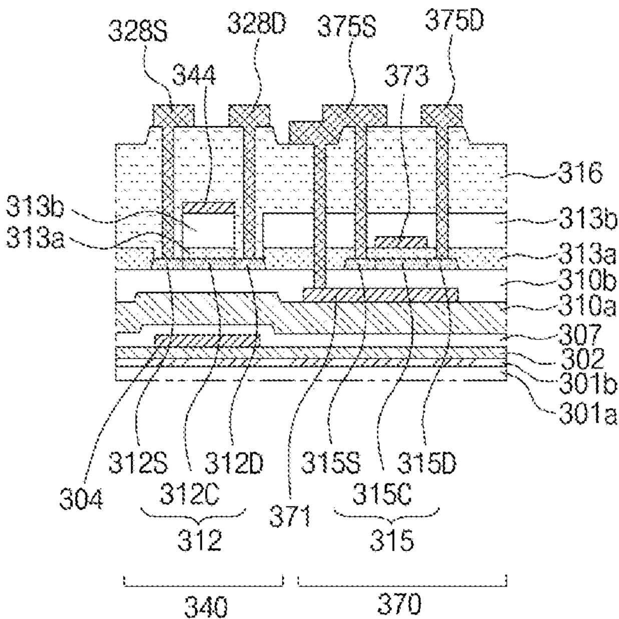
FIG. 6B is a cross-sectional view showing a display apparatus, according to another embodiment of the present disclosure.
Figure 7A:
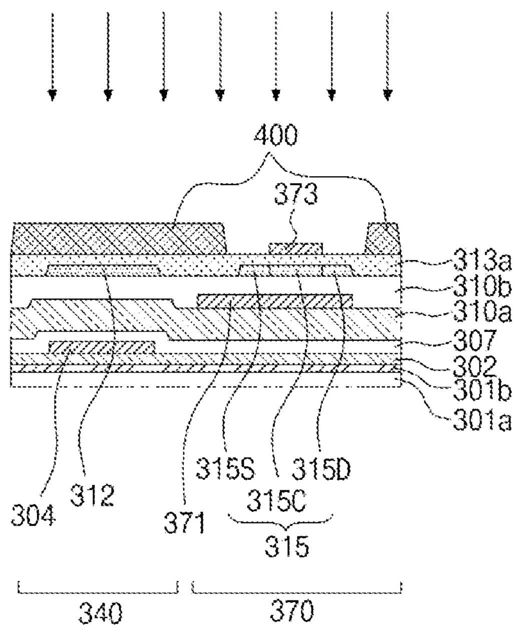
FIGS. 7A to 7C are cross-sectional views showing a fabricating method of a display apparatus, according to another embodiment of the present disclosure.
Figure 7B:
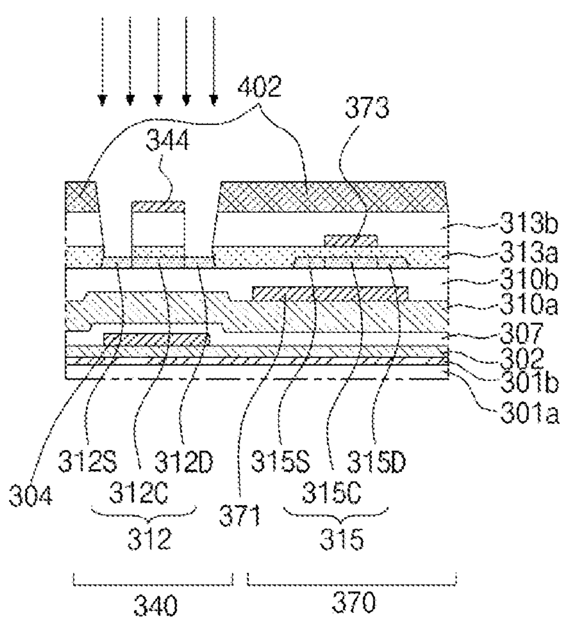
Figure 7C:
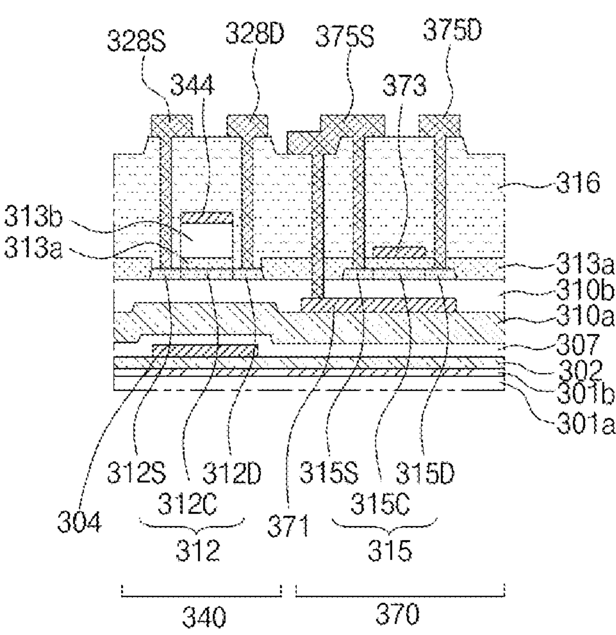

FIG. 6A is a cross-sectional view showing a display apparatus according to another embodiment of the present disclosure, and FIG. 6B is a cross-sectional view showing a display apparatus according to another embodiment of the present disclosure. FIGS. 7A to 7C are cross-sectional views showing a fabricating method of a display apparatus according to another embodiment of the present disclosure.

In a display apparatus according to another embodiment of the present disclosure, at least two or more insulating layers may be disposed on a semiconductor layer. Accordingly, susceptibility (or sensitivity) according to a threshold voltage change of a third transistor 340 may be reduced.

After first to third gate electrodes 373, 314, and 344 of first to third transistors 370, 360, and 340 are formed, a process of forming first to third semiconductor layers 315, 311, and 312 conductive (conductorization process) is performed simultaneously. The first to third semiconductor layers 315, 311, and 312 have different doping concentrations even when the conductorization process of the first to third semiconductor layers 315, 311, and 312 is performed with the same doping conditions. As a result, an element characteristic of the first to third transistors 370, 360 and 340 is deteriorated. Since the first to third semiconductor layers 315, 311, and 312 have different doping concentrations, a resistance increases and a current property in an ON state is deteriorated. Accordingly, an element characteristic of the first to third transistors 370, 360 and 340 is further deteriorated.

After first to third gate electrodes 373, 314 and 344 of first to third transistors 370, 360 and 340 are formed, the conductorization processes of the first to third semiconductor layers 315, 311, and 312 may be differently performed. For example, a third insulating layer 313*a* may be formed on the first to third semiconductor layers 315, 311, and 312, and the first gate electrode 373 and the second gate electrode 314 may be formed on the third insulating layer 313*a*. After the third transistor 340 is covered by a photoresist, the conductorization processes of the first semiconductor layer 315 of the first transistor 370 and the second semiconductor layer 311 of the second transistor 360 may be performed. A fourth insulating layer 313*b* may be formed on the first gate electrode 373 of the first transistor 370, the second gate electrode 314 of the second transistor 360 and the third insulating layer 313*a* of the third transistor 340. After the first transistor 370 and the second transistor 360 are covered by a photoresist, the conductorization process of the third semiconductor layer 312 of the third transistor 340 may be performed. During the conductorization process of the third semiconductor layer 312, it is difficult for a doping concentration of the third semiconductor layer 312 to reach a certain level due to a thickness of the third insulating layer 313*a* and the fourth insulating layer 313*b*. Accordingly, a thickness of a conductive region of the third semiconductor layer 312 of the third transistor 370 may be different from thicknesses of conductive regions of the first semiconductor layer 315 of the first transistor 370 and the second semiconductor layer 311 of the second transistor 360, and the third semiconductor layer 312 of the third transistor 370 may have a different doping concentration from the first semiconductor layer 315 of the first transistor 370 and the second semiconductor layer 311 of the second transistor 360. The third transistor 370 may have a different thickness of a conductive region from the first transistor 370 and the second transistor 360 due to the third insulating layer 313*a* and/or the fourth insulating layer 313*b*. Accordingly, it has been recognized that an element characteristic of the first transistor 370, the second transistor 360, and the third transistor 340 may be deteriorated. The inventors have conducted extensive research and experiments where element characteristic of the first transistor 370, the second transistor 360, and the third transistor 340 is improved. Through extensive research and experiments, a new display apparatus having an improved element characteristic of the first to third transistors 370, 360, and 340 is invented. This is explained below.

FIGS. 6A and 6B and 7A to 7C illustrate a first transistor 370 and a third transistor 340 among transistors of FIG. 5. A second transistor 360, a fourth transistor 330, and a storage capacitor 350 may be configured substantially the same as those described in FIG. 5.

Referring to FIG. 6A, a third insulating layer 313*a* may be disposed on a first semiconductor layer 315 of a first transistor 370. For example, the third insulating layer 313*a* may be disposed to be adjacent to (or contact) a third semiconductor layer 312 of a third transistor 340. For example, the third insulating layer 313*a* may be disposed to be adjacent to (or contact) a third semiconductor layer 312 of a third transistor 340 such that an end line of the third insulating layer 313*a* coincides with an end line of the third semiconductor layer 312. The third insulating layer 313*a* and a fourth insulating layer 313*b* may be disposed on the third semiconductor layer 312 of the third transistor 340. In one embodiment, at least a part of the third insulating layer 313*a* may be disposed on a first semiconductor layer 315 of a first transistor 370 and at least another part of the third insulating layer 313*a* may be disposed on the third semiconductor layer 312. Moreover, at least a part of the fourth insulating layer 313*b* may be disposed on the third semiconductor layer 312.

In another embodiment of the present disclosure, the third insulating layer 313*a* may be disposed on the first semiconductor layer 315 and the second semiconductor layer 311 except for a portion of the third semiconductor layer 312 of the third transistor 340. For example, the third insulating layer 313*a* of the third transistor 340 may overlap the third semiconductor layer 312. The third insulating layer 313*a* may overlap a third channel region 312C of the third transistor 312.

The fourth insulating layer 313*b* may be disposed on the third insulating layer 313*a* of the third transistor 340. The third insulating layer 313*a* and the fourth insulating layer 313*b* of the third transistor 340 may be disposed between a third source electrode 328S and a third drain electrode 328D. For example, the third insulating layer 313*a*, the fourth insulating layer 313*b* and a third gate electrode 344 may be disposed between the third source electrode 328S and the third drain electrode 328D. Since the third transistor 340 includes the third insulating layer 313*a* and the fourth insulating layer 313*b*, susceptibility (or sensitivity) according to a threshold voltage change of the third transistor 340 may be reduced.

The third insulating layer 313*a* and the fourth insulating layer 313*b* of the third transistor 340 may overlap the third semiconductor layer 312. For example, the third insulating layer 313*a* and the fourth insulating layer 313*b* may overlap the third channel 312C of the third semiconductor layer 312. As described in conjunction with FIGS. 7A-7C below, at least a portion of the source region 312S or the drain region 312D of the third transistor 340 may be exposed through an area between one end of the part of the third insulating layer 313*a* disposed adjacent to the third semiconductor layer 312 and the another part of the third insulating layer 313*a*, and where the exposed portion is doped with a dopant. In one instance, the one end of the part of the third insulating layer 313*a* may contact the end of the source region 312S or the drain region 312D of the third semiconductor layer 312.

In another embodiment of the present disclosure, a fifth insulating layer 316 may be disposed on the first gate electrode 373 of the first transistor 370 and the second gate electrode 314 of the second transistor 360. For example, the first transistor 370 may include a first semiconductor layer 315, a third insulating layer 313*a* on the first semiconductor layer 315, a first gate electrode 373 on the third insulating layer 313*a* and a fifth insulating layer 316 on the first gate electrode 373. The fifth insulating layer 316 may cover the first gate electrode 373 of the first transistor 370. The fifth insulating layer 316 may contact a top surface (or an upper surface) of the third insulating layer 313*a* of the first transistor 370. For example, the fifth insulating layer 316 may contact a top surface (or an upper surface) of the third insulating layer 313*a* and the first gate electrode 373 of the first transistor 370.

The second transistor 360 may include a second semiconductor layer 311, a third insulating layer 313*a* on the second semiconductor layer 311, a second gate electrode 314 on the third insulating layer 313*a* and a fifth insulating layer 316 on the second gate electrode 314. The fifth insulating layer 316 may cover the second gate electrode 314 of the second transistor 360. The fifth insulating layer 316 may contact a top surface (or an upper surface) of the second gate electrode 314 of the second transistor 360. The fifth insulating layer 316 may contact a top surface (or an upper surface) of the third insulating layer 313*a* of the second transistor 360. For example, the fifth insulating layer 316 may contact a top surface (or an upper surface) of the third insulating layer 313*a* and the second gate electrode 314 of the second transistor 360.

In another embodiment of the present disclosure, the fifth insulating layer 316 of the third transistor 340 may be disposed on a third source region 312S and a third drain region 312D of the third transistor 340. For example, the fifth insulating layer 316 of the third transistor 340 may be disposed in a third source region 312S and a third drain region 312D of the third transistor 340. For example, the fifth insulating layer 316 of the third transistor 340 may be disposed on the third semiconductor layer 312, the third insulating layer 313*a*, the fourth insulating layer 313*b* and the third gate electrode 344. The fifth insulating layer 316 of the third transistor 340 may cover the third semiconductor layer 312, the third insulating layer 313*a*, the fourth insulating layer 313*b* and the third gate electrode 344. The third transistor 340 may include a third semiconductor layer 312, a third insulating layer 313*a* on the third semiconductor layer 312, a fourth insulating layer 313*b* on the third insulating layer 313*a* and a fifth insulating layer 316 on the third gate electrode 344. The fifth insulating layer 316 may contact a top surface (an upper surface) of the third semiconductor layer 312 of the third transistor 340. For example, the fifth insulating layer 316 may contact a top surface (an upper surface) of the third gate electrode 344 of the third transistor 340. The fifth insulating layer 316 may contact a top surface (an upper surface) of the third semiconductor layer 312 and a top surface (an upper surface) of the third gate electrode 344.

Referring to FIG. 6B, a third insulating layer 313*a* may be disposed on a first semiconductor layer 315 of a first transistor 370. For example, the third insulating layer 313*a* may be disposed on a first gate electrode 373 of a first transistor 370 and a third semiconductor layer 312 of a third transistor 340. The third insulating layer 313*a* may be disposed to be adjacent to (contact) the third semiconductor layer 312 of the third transistor 340. For example, the third insulating layer 313*a* may be disposed to be adjacent to (contact) the third semiconductor layer 312 of the third transistor 340 such that an end line of the third insulating layer 313*a* coincides with an end line of the third semiconductor layer 312. In one embodiment, at least a part of the third insulating layer 313*a* may be disposed on a first semiconductor layer 315 of a first transistor 370 and at least another part of the third insulating layer 313*a* may be disposed on the third semiconductor layer 312. Moreover, at least a part of the fourth insulating layer 313*b* may be disposed on the third semiconductor layer 312.

In another embodiment of the present disclosure, the third insulating layer 313*a* may be disposed on the first semiconductor layer 315 and the second semiconductor layer 311 except for a portion of the third semiconductor layer 312 of the third transistor 340. For example, the third insulating layer 313*a* of the third transistor 340 may overlap the third semiconductor layer 312. The third insulating layer 313*a* may overlap a third channel region 312C of the third transistor 312.

The fourth insulating layer 313*b* may be disposed on the third insulating layer 313*a* of the third transistor 340 and the first gate electrode 373 of the first transistor 370. The fourth insulating layer 313*b* may be disposed to be adjacent to the third semiconductor layer 312 of the third transistor 340. For example, the fourth insulating layer 313*b* may be disposed to be adjacent to the third semiconductor layer 312 of the third transistor 340 such that an end line of the fourth insulating layer 313*b* coincides with an end line of the third semiconductor layer 312. For example, the third insulating layer 313*a* and the fourth insulating layer 313*b* may be disposed to be adjacent to the third semiconductor layer 312 of the third transistor 340. For example, the third insulating layer 313*a* and the fourth insulating layer 313*b* may be disposed to be adjacent to the third semiconductor layer 312 of the third transistor 340 such that an end line of the fourth insulating layer 313*b* coincides with an end line of the third semiconductor layer 312.

The third insulating layer 313*a* and the fourth insulating layer 313*b* of the third transistor 340 may be disposed between a third source electrode 328S and a third drain electrode 328D. For example, the third insulating layer 313*a* and the fourth insulating layer 313*b* of the third transistor 340 may be disposed in a third source electrode 328S and a third drain electrode 328D. For example, the third insulating layer 313*a*, the fourth insulating layer 313*b* and a third gate electrode 344 may be disposed between the third source electrode 328S and the third drain electrode 328D. For example, the third insulating layer 313*a*, the fourth insulating layer 313*b* and a third gate electrode 344 may be disposed in the third source electrode 328S and the third drain electrode 328D. Since the third transistor 340 includes the third insulating layer 313*a* and the fourth insulating layer 313*b*, susceptibility (or sensitivity) according to a threshold voltage change of the third transistor 340 may be reduced.

The third insulating layer 313*a* and the fourth insulating layer 313*b* of the third transistor 340 may overlap the third semiconductor layer 312. For example, the third insulating layer 313*a* and the fourth insulating layer 313*b* may overlap the third channel 312C of the third semiconductor layer 312. As described in conjunction with FIGS. 7A-7C below, at least a portion of the source region 312S or the drain region 312D of the third transistor 340 may be exposed through an area between one end of the part of the third insulating layer 313*a* disposed adjacent to the third semiconductor layer 312 and the another part of the third insulating layer 313*a*, and where the exposed portion is doped with a dopant.

In another embodiment of the present disclosure, a fifth insulating layer 316 may be disposed on the fourth insulating layer 313*b* of the first transistor 370 and the second gate electrode 314 of the second transistor 360. For example, the first transistor 370 may include a first semiconductor layer 315, a third insulating layer 313*a* on the first semiconductor layer 315, a first gate electrode 373 on the third insulating layer 313*a*, a fourth insulating layer 313*b* on the first gate electrode 373 and a fifth insulating layer 316 on the fourth insulating layer 313*b*. The fifth insulating layer 316 may cover the fourth insulating layer 313*b* of the first transistor 370. For example, the fifth insulating layer 316 may contact a top surface (or an upper surface) of the fourth insulating layer 313*b* of the first transistor 370. The fifth insulating layer 316 may contact a top surface of the third gate electrode 344 of the third transistor 340. The fifth insulating layer 316 may contact a top surface (or an upper surface) of the fourth insulating layer 313*b* of the first transistor 370 and a top surface (or an upper surface) of the third gate electrode 344 of the third transistor 340.

The second transistor 360 may include a second semiconductor layer 311, a third insulating layer 313*a* on the second semiconductor layer 311, a second gate electrode 314 on the third insulating layer 313*a*, a fourth insulating layer 313*b* on the second gate electrode 314 and a fifth insulating layer 316 on the second gate electrode 314. The fifth insulating layer 316 may cover the fourth insulating layer 313*b* of the second transistor 360. The fifth insulating layer 316 may contact a top surface (or an upper surface) of the fourth insulating layer 313*b* of the second transistor 360. The fifth insulating layer 316 may contact a top surface (or an upper surface) of the third gate electrode 344 of the third transistor 340. For example, the fifth insulating layer 316 may contact a top surface (or an upper surface) of the fourth insulating layer 313*b* of the second transistor 360 and the third gate electrode 344 of the third transistor 340.

In another embodiment of the present disclosure, the fifth insulating layer 316 of the third transistor 340 may be disposed on a third source region 312S and a third drain region 312D of the third transistor 340. For example, the fifth insulating layer 316 of the third transistor 340 may be disposed in a third source region 312S and a third drain region 312D of the third transistor 340. For example, the fifth insulating layer 316 of the third transistor 340 may be disposed on the third semiconductor layer 312, the third insulating layer 313*a*, the fourth insulating layer 313*b* and the third gate electrode 344. The fifth insulating layer 316 of the third transistor 340 may cover the third semiconductor layer 312, the third insulating layer 313*a*, the fourth insulating layer 313*b* and the third gate electrode 344. The third transistor 340 may include a third semiconductor layer 312, a third insulating layer 313*a* on the third semiconductor layer 312, a fourth insulating layer 313*b* on the third insulating layer 313*a*, a third gate electrode 344 on the fourth insulating layer 313*b*, and a fifth insulating layer 316 on the third gate electrode 344. The fifth insulating layer 316 may contact a top surface (or an upper surface) of the third semiconductor layer 312 of the third transistor 340. For example, the fifth insulating layer 316 may contact a top surface (or an upper surface) of the third gate electrode 344 of the third transistor 340. The fifth insulating layer 316 may contact a top surface (or an upper surface) of the third semiconductor layer 312 and a top surface (or an upper surface) of the third gate electrode 344.

FIGS. 7A to 7C illustrate a fabrication process of the display apparatus of FIG. 6A.

Referring to FIG. 7A, the third insulating layer 313*a* is formed on the first transistor 370 and the third transistor 340, and the first gate electrode 373 is formed on the third insulating layer 313*a* of the first transistor 370. Next, the conductorization process (arrow) of the first semiconductor layer 315 of the first transistor 370 is performed. After the photoresist 400 is disposed to cover the third transistor 340 except for the first semiconductor layer 315, the conductorization process of the first semiconductor layer 315 may be performed. For example, the conductorization process of the first semiconductor layer 315 may be performed without an etching of the third insulating layer 313*a*. Accordingly, the first semiconductor layer 315 may include the first source region 315S, the first channel region 315C, and the first drain region 315D. The conductorization process of the second semiconductor layer 311 of the second transistor 360 the same as the conductorization process of the first transistor 370 may be performed. Accordingly, the second semiconductor layer 311 may include the second source region 311S, the second channel region 311C, and the second drain region 311D.

Referring to FIG. 7B, the fourth insulating layer 313*b* is formed on the first gate electrode 373 of the first transistor 370 and the third insulating layer 313*a* of the third transistor 340, and the third gate electrode 344 is formed on the fourth insulating layer 313*b* of the third transistor 340. Next, the conductorization process of the third semiconductor layer 312 of the third transistor 340 is performed. After the photoresist 402 is disposed to cover the first transistor 370 except for the third semiconductor layer 312, the conductorization process of the third semiconductor layer 312 may be performed through an etching process (arrow) of the third insulating layer 313*a* and the fourth insulating layer 313*b* in a conductive region of the third semiconductor layer 312. For example, the etching process may be a wet etching or a dry etching, but embodiments of the present disclosure are not limited thereto. As a result, the third semiconductor layer 312 may include the third source region 312S, the third channel region 312C, and the third drain region 312D. After the conductorization process of the third semiconductor layer 312 of the third transistor 340, the photoresist 402 is removed, and the fourth insulating layer 313*b* of the first transistor 370 may be etched. The third insulating layer 313*a* may be patterned through the etching process of the fourth insulating layer 313*b*. For example, the third insulating layer 313*a* may be patterned to have a right angle or to have an acute angle or a slanting surface (or an inclined surface), but embodiments of the present disclosure are not limited thereto. For example, the first transistor 370 and the second transistor 360 may include the third insulating layer 313*a*.

In another embodiment of the present disclosure, since the conductorization process of the third semiconductor layer 312 of the third transistor 340 is performed through an etching process of the third insulating layer 313*a* and the fourth insulating layer 313*b*, a problem that the conductorization process of the third semiconductor layer 312 is not performed due to a thickness difference of the third insulating layer 313*a* and the fourth insulating layer 313*b* may be solved. For example, since the conductorization process of the third semiconductor layer 312 of the third transistor 340 is performed while the third insulating layer 313*a* and the fourth insulating layer 313*b* are etched, it may be prevented that the conductorization process of the third semiconductor layer 312 is not performed due to a thickness difference of the third insulating layer 313*a* and the fourth insulating layer 313*b*. As a result, it may be improved that the display panel is deteriorated due to a leakage of an electron and a rise of a resistance when the conductorization process of the third semiconductor layer 312 is not performed. The element characteristic of the third transistor 340 may be improved.

Referring to FIG. 7C, the fifth insulating layer 316 is formed on the first gate electrode 373 and the third gate electrode 344. The fifth insulating layer 316 may cover the first gate electrode 373 and the third gate electrode 344. The fifth insulating layer 316 may cover the third semiconductor layer 312. The first source electrode 375S, the first drain electrode 375D, the third source electrode 328S and the third drain electrode 328D are formed on the fifth insulating layer 316 to constitute the first transistor 370 and the third transistor 340. The second transistor 360 may be formed through the same process as the first transistor 370. The second source electrode 319S and the second drain electrode 319D are formed on the fifth insulating layer 316 to constitute the second transistor 360.

A fabrication process of the display apparatus of FIG. 6B according to another embodiment of the present disclosure may be illustrate hereinafter with reference to FIGS. 7A to 7C. Since the forming step of FIG. 7A of the display apparatus of FIG. 6B is the same as the forming step of FIG. 7A of the display apparatus of FIG. 6A, illustration on the forming step of FIG. 7A may be omitted.

Referring to FIG. 7B, the fourth insulating layer 313*b* is formed on the first gate electrode 373 of the first transistor 370 and the third insulating layer 313*a* of the third transistor 340, and the third gate electrode 344 is formed on the fourth insulating layer 313*b* of the third transistor 340. Next, the conductorization process of the third semiconductor layer 312 of the third transistor 340 is performed. After the photoresist 402 is disposed to cover the first transistor 370 except for the third semiconductor layer 312, the conductorization process of the third semiconductor layer 312 may be performed through an etching process (arrow) of the third insulating layer 313*a* and the fourth insulating layer 313*b* in a conductive region of the third semiconductor layer 312. For example, the etching process may be a wet etching or a dry etching, but embodiments of the present disclosure are not limited thereto. Accordingly, the third semiconductor layer 312 may include the third source region 312S, the third channel region 312C and the third drain region 312D. In another embodiment of the present disclosure, the fourth insulating layer 313*b* may not be etched. For example, the third insulating layer 313*a* and the fourth insulating layer 313*b* may be disposed to be adjacent to the third semiconductor layer 312. For example, the third insulating layer 313*a* and the fourth insulating layer 313*b* may be disposed to be adjacent to the third semiconductor layer 312 such that end lines of the third insulating layer 313*a* and the fourth insulating layer 313*b* coincide with an end line of the third semiconductor layer 312. In a third embodiment of the present disclosure, since the conductorization process of the third semiconductor layer 312 of the third transistor 340 is performed through an etching process of the third insulating layer 313*a* and the fourth insulating layer 313*b*, a problem that the conductorization process of the third semiconductor layer 312 is not performed due to a thickness difference of the third insulating layer 313*a* and the fourth insulating layer 313*b* may be solved. For example, since the conductorization process of the third semiconductor layer 312 of the third transistor 340 is performed while the third insulating layer 313*a* and the fourth insulating layer 313*b* are etched, it may be prevented that the conductorization process of the third semiconductor layer 312 is not performed due to a thickness difference of the third insulating layer 313a and the fourth insulating layer 313b. Accordingly, it may be improved that the display panel is deteriorated due to a leakage of an electron and a rise of a resistance when the conductorization process of the third semiconductor layer 312 is not performed. The element characteristic of the third transistor 340 may be improved.

As described in FIG. 7C, the fifth insulating layer 316 is formed on the first gate electrode 373 and the third gate electrode 344. The fifth insulating layer 316 may cover the first gate electrode 373 and the third gate electrode 344. The first source electrode 375S, the first drain electrode 375D, the third source electrode 328S and the third drain electrode 328D are formed on the fifth insulating layer 316 to constitute the first transistor 370 and the third transistor 340. In one embodiment, the another part of the third insulating layer 313a on the third semiconductor layer 312 and the part of the fourth insulating layer 313b on the third insulating layer 313a may be spaced apart from the third source electrode 328S and the third drain electrode 328D due to the etching process. The second transistor 360 may be formed through the same process as the first transistor 370. The second source electrode 319S and the second drain electrode 319D are formed on the fifth insulating layer 316 to constitute the second transistor 360.

In another embodiment of the present disclosure, after the third transistor 340 including the third insulating layer 313a and the fourth insulating layer 313b is formed, the conductorization process of the third semiconductor layer 312 is performed through the etching process of the third insulating layer 313a and the fourth insulating layer 313b. As a result, a problem that the third semiconductor layer 312 of the third transistor 340 has different doping concentrations due to a thickness difference of the third insulating layer 313a and the fourth insulating layer 313b may be solved.

A display apparatus according to one or more embodiments of the present disclosure may be applied to or included in a mobile apparatus, a video phone, a smart watch, a watch phone, a wearable apparatus, a watch phone, a wearable apparatus, a foldable apparatus, a rollable apparatus, a bendable apparatus, a flexible apparatus, a curved apparatus, a sliding apparatus, a variable apparatus, an electronic book, an electronic notebook, a portable multimedia player (PMP), a personal digital assistant (PDA), an MP3 player, a mobile medical apparatus, a desktop personal computer (PC), a laptop PC, a netbook computer, a workstation, a navigation, a vehicle navigation, a vehicle display apparatus, a vehicle apparatus, a theater apparatus, a theater display apparatus, a television, a wallpaper apparatus, a signage apparatus, a game apparatus, a notebook, a monitor, a camera, a camcorder and an electronic appliance. In addition, the display apparatus according to one or more embodiments of the present disclosure may be applied to or included in an organic light emitting diode lighting apparatus or an inorganic light emitting diode lighting apparatus.

A display apparatus according to one or more embodiments of the present disclosure are described below.

A display apparatus according to one or more embodiments of a present disclosure may comprise a substrate having a display area and a non-display area, a first transistor including a first semiconductor layer on the substrate, a first insulating layer on the first semiconductor layer, a first gate electrode on the first insulating layer and a second insulating layer on the first gate electrode, a second transistor including a second semiconductor layer on the substrate and a second gate electrode on the first insulating layer, and a third transistor including a third semiconductor layer on the substrate and a third gate electrode on the second insulating layer.

According to one or more embodiments of the present disclosure, the first insulating layer may be disposed on the second semiconductor layer, and the second insulating layer may be disposed on the second gate electrode.

According to one or more embodiments of the present disclosure, the first insulating layer may be disposed on the third semiconductor layer, and the second insulating layer of the third transistor may be disposed on the first insulating layer.

A display apparatus according to one or more embodiments of the present disclosure may comprise a substrate having a display area and a non-display area, a first transistor including a first semiconductor layer on the substrate, a first insulating layer on the first semiconductor layer and a first gate electrode on the first insulating layer, a second transistor including a second semiconductor layer on the substrate, the first insulating layer on the second semiconductor layer and a second gate electrode on the first insulating layer, and a third transistor including a third semiconductor layer on the substrate, the first insulating layer on the third semiconductor layer, a second insulating layer on the first insulating layer and a third gate electrode on the second insulating layer.

According to one or more embodiments of the present disclosure, the third semiconductor layer may include a third channel region, and the first insulating layer and the second insulating layer of the third transistor may overlap the third channel region.

According to one or more embodiments of the present disclosure, the display apparatus may further include a first source electrode and a first drain electrode on the first gate electrode, a second source electrode and a second drain electrode on the second gate electrode, and a third source electrode and a third drain electrode on the third gate electrode.

According to one or more embodiments of the present disclosure, the first insulating layer and the second insulating layer may be disposed between the third source electrode and the third drain electrode.

According to one or more embodiments of the present disclosure, the first insulating layer, the second insulating layer, and the third gate electrode may be disposed between the third source electrode and the third drain electrode.

According to one or more embodiments of the present disclosure, the display apparatus may further include a third insulating layer on the first insulating layer, and the third insulating layer may cover the third semiconductor layer.

According to one or more embodiments of the present disclosure, the first insulating layer of the first transistor and the first insulating layer of the second transistor may be disposed to be adjacent to the third semiconductor layer of the third transistor.

According to one or more embodiments of the present disclosure, the second insulating layer may be disposed on the first gate electrode of the first transistor and the second gate electrode of the second transistor, and the first insulating layer and the second insulating layer of the first transistor and the first insulating layer and the second insulating layer of the second transistor may be disposed to be adjacent to the third semiconductor layer.

According to one or more embodiments of the present disclosure, a distance between the first semiconductor layer and the first gate electrode may be a same as a distance between the second semiconductor layer and the second gate electrode.

According to one or more embodiments of the present disclosure, a distance between the first semiconductor layer and the first gate electrode may be different from a distance between the third semiconductor layer and the third gate electrode.

According to one or more embodiments of the present disclosure, a distance between the first semiconductor layer and the first gate electrode may be smaller than a distance between the third semiconductor layer and the third gate electrode.

According to one or more embodiments of the present disclosure, a distance between the second semiconductor layer and the second gate electrode may be different from a distance between the third semiconductor layer and the third gate electrode.

According to one or more embodiments of the present disclosure, a distance between the second semiconductor layer and the second gate electrode may be smaller than a distance between the third semiconductor layer and the third gate electrode.

According to one or more embodiments of the present disclosure, a capacitance between the third semiconductor layer and the third gate electrode may be smaller than a capacitance between the first semiconductor layer and the first gate electrode.

According to one or more embodiments of the present disclosure, a capacitance between the third semiconductor layer and the third gate electrode may be smaller than a capacitance between the second semiconductor layer and the second gate electrode.

According to one or more embodiments of the present disclosure, the first gate electrode may be disposed in a different layer from the third gate electrode.

According to one or more embodiments of the present disclosure, the second gate electrode may be disposed in a different layer from the third gate electrode.

According to one or more embodiments of the present disclosure, the display apparatus may further include a fourth gate electrode under the first semiconductor layer, a fifth gate electrode under the second semiconductor layer, and a sixth gate electrode under the third semiconductor layer.

According to one or more embodiments of the present disclosure, a distance between the fourth gate electrode and the first semiconductor layer may be smaller than a distance between the fifth gate electrode and the second semiconductor layer.

According to one or more embodiments of the present disclosure, a distance between the fourth gate electrode and the first semiconductor layer may be smaller than a distance between the sixth gate electrode and the third semiconductor layer.

According to one or more embodiments of the present disclosure, the display apparatus may further include a first source electrode and a first drain electrode on the first gate electrode, a second source electrode and a second drain electrode on the second gate electrode, and a third source electrode and a third drain electrode on the third gate electrode, and the first source electrode may be connected to the fourth gate electrode.

According to one or more embodiments of the present disclosure, the first semiconductor layer and the second semiconductor layer may include an oxide semiconductor material.

According to one or more embodiments of the present disclosure, the third semiconductor layer may include an oxide semiconductor material.

According to one or more embodiments of the present disclosure, a thickness of the first insulating layer may be different from a thickness of the second insulating layer.

According to one or more embodiments of the present disclosure, the non-display area may include a gate driving part, and the display apparatus may further include a fourth transistor in the gate driving part and including a fourth semiconductor layer.

According to one or more embodiments of the present disclosure, the fourth semiconductor layer may include a polycrystalline semiconductor material.

According to one or more embodiments of the present disclosure, the display apparatus may further include an emitting element in the display area, an encapsulation part on the emitting element, and a touch part on the encapsulation part.

According to one or more embodiments of the present disclosure, the display apparatus may further include a color filter layer on the touch part or between the touch part and the encapsulation part.

A display apparatus according to one or more embodiments of the present disclosure may comprise a substrate having a display area and a non-display area, a first transistor including a first semiconductor layer on the substrate, the first semiconductor layer including oxide semiconductor, at least a part of a first insulating layer on the first semiconductor layer, and a first gate electrode on the part of the first insulating layer. The display apparatus may also include a second transistor including a second semiconductor layer on the substrate, the first insulating layer on the second semiconductor layer and a second gate electrode on the first insulating layer. The display apparatus may also include a third transistor including a third semiconductor layer on the substrate, the third semiconductor layer including oxide semiconductor. The third semiconductor layer may include a channel region, a source region, and a drain region. At least another part of the first insulating layer may be disposed on the third semiconductor layer, and at least a part of a second insulating layer may be disposed on the first insulating layer, and a third gate electrode may be disposed on the second insulating layer. At least a portion of the source region or the drain region may be exposed through an area between one end of the part of the first insulating layer disposed adjacent to the third semiconductor layer and the another part of the first insulating layer. The exposed portion may be doped with a dopant.

According to one or more embodiments of the present disclosure, the one end of the part of the first insulating layer may contact an end of the source region or the drain region of the third semiconductor layer.

According to one or more embodiments of the present disclosure, another part of the second insulating layer may be disposed on the part of the first insulating layer, and one end of the another part of the second insulating layer may be disposed adjacent to the third semiconductor layer.

According to one or more embodiments of the present disclosure, the third semiconductor layer may include a third channel region, and the another part of the first insulating layer and the part of the second insulating layer of the third transistor may overlap the third channel region.

According to one or more embodiments of the present disclosure, the display apparatus may include a first source electrode and a first drain electrode on the first gate electrode, a second source electrode and a second drain electrode on the second gate electrode, and a third source electrode and a third drain electrode on the third gate electrode.

According to one or more embodiments of the present disclosure, the another part of the first insulating layer and the part of the second insulating layer may be disposed between the third source electrode and the third drain electrode.

According to one or more embodiments of the present disclosure, the another part of the first insulating layer and the part of the second insulating layer may be spaced apart from the third source electrode or the third drain electrode.

According to one or more embodiments of the present disclosure, the first insulating layer of the first transistor and the first insulating layer of the second transistor may be disposed to be adjacent to the third semiconductor layer of the third transistor.

According to one or more embodiments of the present disclosure, the second insulating layer may be disposed on the first gate electrode of the first transistor and the second gate electrode of the second transistor. The first insulating layer and the second insulating layer of the first transistor and the first insulating layer and the second insulating layer of the second transistor may be disposed to be adjacent to the third semiconductor layer According to one or more embodiments of the present disclosure, a distance between the first semiconductor layer and the first gate electrode may be a same as a distance between the second semiconductor layer and the second gate electrode.

According to one or more embodiments of the present disclosure, a distance between the first semiconductor layer and the first gate electrode may be smaller than a distance between the third semiconductor layer and the third gate electrode.

According to one or more embodiments of the present disclosure, a distance between the second semiconductor layer and the second gate electrode may be smaller than a distance between the third semiconductor layer and the third gate electrode.

According to one or more embodiments of the present disclosure, a capacitance between the third semiconductor layer and the third gate electrode may be smaller than a capacitance between the first semiconductor layer and the first gate electrode. A capacitance between the third semiconductor layer and the third gate electrode may be smaller than a capacitance between the second semiconductor layer and the second gate electrode.

According to one or more embodiments of the present disclosure, the first gate electrode may be disposed in a different layer from the third gate electrode. The second gate electrode may be disposed in a different layer from the third gate electrode.

According to one or more embodiments of the present disclosure, the display apparatus may further include a fourth gate electrode under the first semiconductor layer, a fifth gate electrode under the second semiconductor layer, and a sixth gate electrode under the third semiconductor layer.

According to one or more embodiments of the present disclosure, a distance between the fourth gate electrode and the first semiconductor layer may be smaller than a distance between the fifth gate electrode and the second semiconductor layer. A distance between the fourth gate electrode and the first semiconductor layer may be smaller than a distance between the sixth gate electrode and the third semiconductor layer.

According to one or more embodiments of the present disclosure, the non-display area may include a gate driving part. The display apparatus may further include the fourth semiconductor layer includes a polycrystalline semiconductor material.

According to one or more embodiments of the present disclosure, the display apparatus may further include an emitting device in the display area, an encapsulation part on the emitting element, and a touch part on the encapsulation part.

According to one or more embodiments of the present disclosure, the display apparatus may further include a color filter layer on the touch part or between the touch part and the encapsulation part.

According to one or more embodiments of the present disclosure, the first semiconductor layer may include a channel region, a source region, and a drain region. The part of the first insulating layer may covers the source region and the drain region of the first semiconductor layer.

It will be apparent to those skilled in the art that various modifications and variations can be made in the present disclosure without departing from the scope of the present disclosure. Thus, it is intended that the present disclosure cover the modifications and variations of this disclosure provided they come within the scope of the appended claims and their equivalents.

What is claimed is:

1. A display apparatus, comprising:

a substrate having a display area and a non-display area;

a first transistor including:

a first semiconductor layer on the substrate, the first semiconductor layer including oxide semiconductor, at least a part of a first insulating layer on the first semiconductor layer, a first gate electrode on the part of the first insulating layer and a second insulating layer on the first gate electrode;

a second transistor including a second semiconductor layer on the substrate and a second gate electrode on the first insulating layer; and a third transistor including:

a third semiconductor layer on the substrate, the third semiconductor layer including oxide semiconductor, at least another part of the first insulating layer on the third semiconductor layer, at least a part of the second insulating layer on the first insulating layer, and a third gate electrode on the part of the second insulating layer, wherein a top surface of the second insulating layer is disposed below the third gate electrode and disposed over at least one of the first gate electrode and the second gate electrode.

2. The display apparatus of claim 1, wherein the first insulating layer is disposed on the second semiconductor layer, and the second insulating layer is disposed on the second gate electrode.

3. The display apparatus of claim 1, wherein a distance between the first semiconductor layer and the first gate electrode is a same distance as a distance between the second semiconductor layer and the second gate electrode.

4. The display apparatus of claim 1, wherein a distance between the first semiconductor layer and the first gate electrode is smaller than a distance between the third semiconductor layer and the third gate electrode.

5. The display apparatus of claim 1, wherein a distance between the second semiconductor layer and the second gate electrode is smaller than a distance between the third semiconductor layer and the third gate electrode.

6. The display apparatus of claim 1, wherein a capacitance between the third semiconductor layer and the third gate electrode is smaller than a capacitance between the first semiconductor layer and the first gate electrode, and wherein a capacitance between the third semiconductor layer and the third gate electrode is smaller than a capacitance between the second semiconductor layer and the second gate electrode.

7. The display apparatus of claim 1, wherein the first gate electrode is disposed in a different layer from the third gate electrode, and wherein the second gate electrode is disposed in a different layer from the third gate electrode.

8. The display apparatus of claim 1, further comprising:

a fourth gate electrode under the first semiconductor layer;

a fifth gate electrode under the second semiconductor layer; and a sixth gate electrode under the third semiconductor layer.

9. The display apparatus of claim 8, wherein a distance between the fourth gate electrode and the first semiconductor layer is smaller than a distance between the fifth gate electrode and the second semiconductor layer, and wherein a distance between the fourth gate electrode and the first semiconductor layer is smaller than a distance between the sixth gate electrode and the third semiconductor layer.

10. The display apparatus of claim 1, further comprising:

a first source electrode and a first drain electrode on the first gate electrode;

a second source electrode and a second drain electrode on the second gate electrode; and a third source electrode and a third drain electrode on the third gate electrode, wherein the first source electrode is connected to a fourth gate electrode.

11. The display apparatus of claim 1, wherein the non-display area includes a gate driving part, further comprising a fourth transistor in the gate driving part and including a fourth semiconductor layer, wherein the fourth semiconductor layer includes a polycrystalline semiconductor material.

12. The display apparatus of claim 1, further comprising:

an emitting device in the display area;

an encapsulation part on the emitting device;

a touch part on the encapsulation part; and a color filter layer on the touch part or between the touch part and the encapsulation part.

* * * * *